(12) United States Patent
Tiwari

(10) Patent No.: US 10,593,418 B2
(45) Date of Patent: *Mar. 17, 2020

(54) COMPARISON OPERATIONS IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 179 days.

This patent is subject to a terminal disclaimer.

(21) Appl. No.: 15/822,748

(22) Filed: Nov. 27, 2017

(65) Prior Publication Data

US 2018/0082756 A1   Mar. 22, 2018

Related U.S. Application Data

(63) Continuation of application No. 14/716,079, filed on May 19, 2015, now Pat. No. 9,830,999.

(Continued)

(51) Int. Cl.
*G11C 29/12* (2006.01)
*G06F 15/78* (2006.01)
(Continued)

(52) U.S. Cl.
CPC ...... *G11C 29/1201* (2013.01); *G06F 9/30029* (2013.01); *G06F 9/30032* (2013.01);
(Continued)

(58) Field of Classification Search
CPC ... G11C 11/4091; G11C 11/4096; G11C 7/10; G11C 16/10; G11C 221/4016; G11C 29/1201
See application file for complete search history.

(56) References Cited

U.S. PATENT DOCUMENTS 4,380,046 A   4/1983   Fung
4,435,792 A   3/1984   Bechtolsheim
(Continued)

FOREIGN PATENT DOCUMENTS

CN   1574078   2/2005
CN   102141905   8/2011
(Continued)

OTHER PUBLICATIONS

Office Action for related China Patent Application No. 201580037972.0, dated Apr. 27, 2018, 11 pages.
(Continued)

*Primary Examiner* — April Y Blair
*Assistant Examiner* — Sazzad Hossain
(74) *Attorney, Agent, or Firm* — Brooks, Cameron & Huebsch, PLLC

(57) ABSTRACT

Examples of the present disclosure provide apparatuses and methods related to performing comparison operations in a memory. An example apparatus might include a first group of memory cells coupled to a first access line and configured to store a first element. An example apparatus might also include a second group of memory cells coupled to a second access line and configured to store a second element. An example apparatus might also include sensing circuitry configured to compare the first element with the second element by performing a number of AND operations, OR operations, SHIFT operations, and INVERT operations without transferring data via an input/output (I/O) line.

18 Claims, 17 Drawing Sheets

Related U.S. Application Data

(60) Provisional application No. 62/008,004, filed on Jun. 5, 2014.

(51) Int. Cl.
  *G06F 9/38* (2018.01)
  *G11C 7/06* (2006.01)
  *G06F 9/30* (2018.01)
  *G11C 29/14* (2006.01)
  *G11C 29/32* (2006.01)
  G11C 16/10 (2006.01)
  G11C 7/10 (2006.01)
  G11C 11/4096 (2006.01)
  G11C 11/4091 (2006.01)

(52) U.S. Cl.
  CPC .......... *G06F 9/3877* (2013.01); *G06F 9/3887* (2013.01); *G06F 15/785* (2013.01); *G11C 7/065* (2013.01); *G11C 29/14* (2013.01); *G11C 29/32* (2013.01); G11C 7/10 (2013.01); G11C 11/4091 (2013.01); G11C 11/4096 (2013.01); G11C 16/10 (2013.01); Y02D 10/13 (2018.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,396,567 A | 3/1995 | Liu et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,787,484 A * | 7/1998 | Norman .................. G06F 3/0616 711/137 |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Klidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,542,340 B2 | 6/2009 | Fisch et al. |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,606,098 B2 | 10/2009 | Popoff |
| 7,609,546 B2 | 10/2009 | Rao |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |

(56) References Cited

U.S. PATENT DOCUMENTS

| | | |
|---|---|---|
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,446,748 B2 | 5/2013 | Lam et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 9,589,602 B2* | 3/2017 | Tiwari .................. G11C 7/065 |
| 9,830,999 B2* | 11/2017 | Tiwari ................ G06F 9/30029 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0002528 A1* | 1/2010 | Okawa ..................... G11C 7/02 365/189.06 |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0089166 A1 | 3/2015 | Kogge |
| 2015/0134713 A1 | 5/2015 | Wheeler |

(56) References Cited

U.S. PATENT DOCUMENTS

| | | |
|---|---|---|
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 0214718 | 3/1987 |
| EP | 1473732 | 11/2004 |
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Office Action for related Taiwan Patent Application No. 104118411, dated Aug. 29, 2016, 14 pages.

Warren Jr., Henry S., "Hacker's Delight", Second Edition, Oct. 2013, pp. 181-184 and 194.

Office Action for related Korea Patent Application No. 10-2017-7000270, dated Dec. 28, 2017, 12 pages.

\* cited by examiner

| 496 | 431 | TEMP STORAGE ROWS | | | | | | | | VECTOR ARGUMENTS 472 | | | |
|---|---|---|---|---|---|---|---|---|---|---|---|---|---|
| # | COMP_COMP | 476 ROW_MASK | 478 ROW_LOWACT | 480 ROW_RETAINED | 482 ROW_OBJECT | 484 DESTC | 486 DESTPC | 488 SRCA | 490 SRCB | 492 DEST | 494 DEST+1 |
| 1 | | | | | | 0 | 0 | 0X0309020C | 0X0705080C | 0X0 | 0X0 |
| 2 | | 0X0 | 0X0 | 0X0 | 0X0 | | | | | | |
| 3 | 0X80000000 | 0X80000000 | 0X80000000 | 0X80000000 | 0X80000000 | 0 | 0 | 0X0309020C | 0X0705080C | 0X0 | 0X0 |
| 4 | 0X80808080 | 0X80000000 | 0X80000000 | 0X80000000 | 0X80808080 | 0 | 0 | 0X0309020C | 0X0705080C | 0X0 | 0X0 |
| 5 | 0X01010101 | 0X80000000 | 0X80000000 | 0X80000000 | 0X01010101 | 0 | 0 | 0X0309020C | 0X0705080C | 0X0 | 0X0 |
| 6 | | | | | | | | | | | |

| 496 | 431 COMP_COMP | TEMP STORAGE ROWS 470 | | | | 484 DESTC | 486 DESTPC | VECTOR ARGUMENTS 472 | | | |
|---|---|---|---|---|---|---|---|---|---|---|---|
| | | 476 ROW_MASK | 478 ROW_LOWACT | 480 ROW_RETAINED | 482 ROW_OBJECT | | | 488 SRCA | 490 SRCB | 492 DEST | 494 DEST+1 |
| 7.a | 0XFF000000 | 0XFF000000 | 0X80000000 | 0X80000000 | 0X01010101 | 0 | | 0X0309020C | 0X0705080C | 0X0 | 0X0 |
| b | 0X0800000 | 0XFF000000 | 0X80000000 | 0X00800000 | 0X01010101 | 0 | | 0X0309020C | 0X0705080C | 0X0 | 0X0 |
| c | 0X0309020C | 0XFF000000 | 0X80000000 | 0X00800000 | 0X01010101 | 0 | | 0X0309020C | 0X0705080C | 0X0 | 0X0 |
| d | 0X0301000C | 0XFF000000 | 0X80000000 | 0X00800000 | 0X01010101 | 0 | | 0X0309020C | 0X0705080C | 0X0 | 0X0 |
| e | 0X0301000C | 0XFF000000 | 0XFCFEFFF3 | 0X00800000 | 0X01010101 | 0 | | 0X0309020C | 0X0705080C | 0X0 | 0X0 |
| f | 0XFCFEFFF3 | 0XFF000000 | 0XFCFEFFF3 | 0X00800000 | 0X01010101 | 0 | | 0X0309020C | 0X0705080C | 0X0 | 0X0 |
| g | 0X00080200 | 0XFF000000 | 0XFCFEFFF3 | 0X00800000 | 0X01010101 | 0 | | 0X0309020C | 0X0705080C | 0X0 | 0X0 |
| h | 0X0 | 0XFF000000 | 0XFCFEFFF3 | 0X00800000 | 0X01010101 | 0 | | 0X0309020C | 0X0705080C | 0X0 | 0X0 |
| i | 0X0 | 0XFF000000 | 0XFCFEFFF3 | 0X00800000 | 0X01010101 | 0 | | 0X0309020C | 0X0705080C | 0X0 | 0X0 |
| j | 0X0 | 0XFF000000 | 0XFCFEFFF3 | 0X00800000 | 0X01010101 | 0 | | 0X0309020C | 0X0705080C | 0X0 | 0X0 |
| k | 0XFCFEFFF3 | 0XFF000000 | 0XFCFEFFF3 | 0X00800000 | 0X01010101 | 0 | | 0X0309020C | 0X0705080C | 0X0 | 0X0 |
| l | 0X04040800 | 0XFF000000 | 0XFCFEFFF3 | 0X00800000 | 0X01010101 | 0 | | 0X0309020C | 0X0705080C | 0X0 | 0X0 |
| m | 0X04000000 | 0XFF000000 | 0XFCFEFFF3 | 0X00800000 | 0X01010101 | 0 | | 0X0309020C | 0X0705080C | 0X0 | 0X0 |
| n | 0X04000000 | 0XFF000000 | 0XFCFEFFF3 | 0X00800000 | 0X01010101 | 0 | | 0X0309020C | 0X0705080C | 0X0 | 0X0 |
| o | 0X04000000 | 0XFF000000 | 0XFCFEFFF3 | 0X00800000 | 0X01010101 | 0 | | 0X0309020C | 0X0705080C | 0X0 | 0X04000000 |
| p | 0X0 | 0XFF000000 | 0XFCFEFFF3 | 0X00800000 | 0X01010101 | 0 | | 0X0309020C | 0X0705080C | 0X0 | 0X04000000 |
| q | 0X0 | 0XFF000000 | 0X00000000 | 0X00800000 | 0X01010101 | 0 | | 0X0309020C | 0X0705080C | 0X0 | 0X04000000 |
| r | 0X0 | 0XFF000000 | 0X00000000 | 0X00800000 | 0X01010101 | 0 | | 0X0309020C | 0X0705080C | 0X0 | 0X04000000 |
| s.i | 0X0 | 0XFF000000 | 0X00000000 | 0X00800000 | 0X01010101 | 0 | | 0X0309020C | 0X0705080C | 0X0 | 0X04000000 |
| s.ii | 0X0 | 0XFF000000 | 0X00000000 | 0X00800000 | 0X01010101 | 0 | | 0X0309020C | 0X0705080C | 0X0 | 0X04000000 |
| s.iii | 0X0 | 0XFF000000 | 0X00000000 | 0X00800000 | 0X01010101 | 0 | | 0X0309020C | 0X0705080C | 0X0 | 0X04000000 |
| s.iv | 0X0 | 0XFF000000 | 0X00000000 | 0X00800000 | 0X01010101 | 0 | 0 | 0X0309020C | 0X0705080C | 0X0 | 0X04000000 |
| s.v | 0X0 | 0XFF000000 | 0X00000000 | 0X00800000 | 0X01010101 | 0 | | 0X0309020C | 0X0705080C | 0X0 | 0X04000000 |
| s.vi | 0X0 | 0XFF000000 | 0X00000000 | 0X00800000 | 0X01010101 | 0 | | 0X0309020C | 0X0705080C | 0X0 | 0X04000000 |

*Fig. 4B*

| | 431 COMP_COMP | 476 ROW_MASK | 478 ROW_LOWACT | 480 ROW_RETAINED | 482 ROW_OBJECT | 484 DESTC | 486 DESTPC | 488 SRCA | 490 SRCB | 492 DEST | 494 DEST+1 |
|---|---|---|---|---|---|---|---|---|---|---|---|
| t | 0X04000000 | 0XFF000000 | 0X00000000 | 0X00800000 | 0X01010101 | 0 | 0 | 0X0309020C | 0X0705080C | 0X0 | 0X04000000 |
| u | 0X04000000 | 0XFF000000 | 0X00000000 | 0X00800000 | 0X01010101 | 0 | 0 | 0X0309020C | 0X0705080C | 0X0 | 0X04000000 |
| v | 0X04000000 | 0XFF000000 | 0X04000000 | 0X00800000 | 0X01010101 | 0 | 0 | 0X0309020C | 0X0705080C | 0X0 | 0X04000000 |
| w.i | 0X04000000 | 0XFF000000 | 0X04000000 | 0X00800000 | 0X01010101 | 0 | 0 | 0X0309020C | 0X0705080C | 0X0 | 0X04000000 |
| w.ii | 0X04000000 | 0XFF000000 | 0X04000000 | 0X00800000 | 0X01010101 | 0 | 0 | 0X0309020C | 0X0705080C | 0X0 | 0X04000000 |
| w.iii | 0X01000000 | 0XFF000000 | 0X04000000 | 0X00800000 | 0X01010101 | 0 | 0 | 0X0309020C | 0X0705080C | 0X0 | 0X04000000 |
| w.iv | 0X01000000 | 0XFF000000 | 0X01000000 | 0X00800000 | 0X01010101 | 0 | 3 | 0X0309020C | 0X0705080C | 0X0 | 0X04000000 |
| w.v | 0X01000000 | 0XFF000000 | 0X01000000 | 0X00800000 | 0X01010101 | 0 | 3 | 0X0309020C | 0X0705080C | 0X0 | 0X04000000 |
| w.vi | 0X0 | 0XFF000000 | 0X01000000 | 0X00800000 | 0X01010101 | 0 | 3 | 0X0309020C | 0X0705080C | 0X0 | 0X04000000 |
| x | 0X0 | 0XFF000000 | 0X01000000 | 0X00800000 | 0X01010101 | 0 | 3 | 0X0309020C | 0X0705080C | 0X0 | 0X04000000 |
| y | 0X0 | 0XFF000000 | 0X01000000 | 0X00800000 | 0X01010101 | 0 | 3 | 0X0309020C | 0X0705080C | 0X0 | 0X0FF00000 |
| z | 0X0 | 0XFF000000 | 0X01000000 | 0X00800000 | 0X01010101 | 0 | 3 | 0X0309020C | 0X0705080C | 0X0 | 0X0FF00000 |

*Fig. 4B (continued)*

| | 431 COMP_COMP | TEMP STORAGE ROWS 470 | | | | | 486 DESTPC | VECTOR ARGUMENTS 472 | | | |
|---|---|---|---|---|---|---|---|---|---|---|---|
| 496 | | 476 ROW_MASK | 478 ROW_LOWACT | 480 ROW_RETAINED | 482 ROW_OBJECT | 484 DESTC | | 488 SRCA | 490 SRCB | 492 DEST | 494 DEST+1 |
| 7.a | 0X00FF0000 | 0X00FF0000 | 0X01000000 | 0X00800000 | 0X01010101 | 0 | 3 | 0X0309020C | 0X0705080C | 0X00080000 | 0XFF000000 |
| b | 0X00008000 | 0X00FF0000 | 0X01000000 | 0X00008000 | 0X01010101 | 0 | 3 | 0X0309020C | 0X0705080C | 0X0 | 0XFF000000 |
| c | 0X0309020C | 0X00FF0000 | 0X01000000 | 0X00008000 | 0X01010101 | 0 | 3 | 0X0309020C | 0X0705080C | 0X0 | 0XFF000000 |
| d | 0X0301000C | 0X00FF0000 | 0X01000000 | 0X00008000 | 0X01010101 | 0 | 3 | 0X0309020C | 0X0705080C | 0X0 | 0XFF000000 |
| e | 0X0301000C | 0X00FF0000 | 0XFCFEFFF3 | 0X00008000 | 0X01010101 | 0 | 3 | 0X0309020C | 0X0705080C | 0X0 | 0XFF000000 |
| f | 0XFCFEFFF3 | 0X00FF0000 | 0XFCFEFFF3 | 0X00008000 | 0X01010101 | 0 | 3 | 0X0309020C | 0X0705080C | 0X0 | 0XFF000000 |
| g | 0X00080200 | 0X00FF0000 | 0XFCFEFFF3 | 0X00008000 | 0X01010101 | 0 | 3 | 0X0309020C | 0X0705080C | 0X0 | 0XFF000000 |
| h | 0X00080000 | 0X00FF0000 | 0XFCFEFFF3 | 0X00008000 | 0X01010101 | 0 | 3 | 0X0309020C | 0X0705080C | 0X0 | 0XFF000000 |
| i | 0X00080000 | 0X00FF0000 | 0XFCFEFFF3 | 0X00008000 | 0X01010101 | 0 | 3 | 0X0309020C | 0X0705080C | 0X0 | 0XFF000000 |
| j | 0X00080000 | 0X00FF0000 | 0XFCFEFFF3 | 0X00008000 | 0X01010101 | 0 | 3 | 0X0309020C | 0X0705080C | 0X00080000 | 0XFF000000 |
| k | 0XFCFEFFF3 | 0X00FF0000 | 0XFCFEFFF3 | 0X00008000 | 0X01010101 | 0 | 3 | 0X0309020C | 0X0705080C | 0X00080000 | 0XFF000000 |
| l | 0X04040800 | 0X00FF0000 | 0XFCFEFFF3 | 0X00008000 | 0X01010101 | 0 | 3 | 0X0309020C | 0X0705080C | 0X00080000 | 0XFF000000 |
| m | 0X00040000 | 0X00FF0000 | 0XFCFEFFF3 | 0X00008000 | 0X01010101 | 0 | 3 | 0X0309020C | 0X0705080C | 0X00080000 | 0XFF000000 |
| n | 0XFF040000 | 0X00FF0000 | 0XFCFEFFF3 | 0X00008000 | 0X01010101 | 0 | 3 | 0X0309020C | 0X0705080C | 0X00080000 | 0XFF000000 |
| o | 0XFF040000 | 0X00FF0000 | 0XFCFEFFF3 | 0X00008000 | 0X01010101 | 0 | 3 | 0X0309020C | 0X0705080C | 0X00080000 | 0XFF040000 |
| p | 0X00080000 | 0X00FF0000 | 0XFCFEFFF3 | 0X00008000 | 0X01010101 | 0 | 3 | 0X0309020C | 0X0705080C | 0X00080000 | 0XFF040000 |
| q | 0X00080000 | 0X00FF0000 | 0X00080000 | 0X00008000 | 0X01010101 | 0 | 3 | 0X0309020C | 0X0705080C | 0X00080000 | 0XFF040000 |
| r | 0X00080000 | 0X00FF0000 | 0X00080000 | 0X00008000 | 0X01010101 | 0 | 3 | 0X0309020C | 0X0705080C | 0X00080000 | 0XFF040000 |
| s.i | 0X00080000 | 0X00FF0000 | 0X00080000 | 0X00008000 | 0X01010101 | 0 | 3 | 0X0309020C | 0X0705080C | 0X00080000 | 0XFF040000 |
| s.ii | 0X00080000 | 0X00FF0000 | 0X00080000 | 0X00008000 | 0X01010101 | 0 | 3 | 0X0309020C | 0X0705080C | 0X00080000 | 0XFF040000 |
| s.iii | 0X00080000 | 0X00FF0000 | 0X00080000 | 0X00008000 | 0X01010101 | 0 | 3 | 0X0309020C | 0X0705080C | 0X00080000 | 0XFF040000 |
| s.iv | 0X00080000 | 0X00FF0000 | 0X00080000 | 0X00008000 | 0X01010101 | 4 | 3 | 0X0309020C | 0X0705080C | 0X00080000 | 0XFF040000 |
| s.v | 0X00040000 | 0X00FF0000 | 0X00080000 | 0X00008000 | 0X01010101 | 4 | 3 | 0X0309020C | 0X0705080C | 0X00080000 | 0XFF040000 |
| s.vi | 0X0 | 0X00FF0000 | 0X00080000 | 0X00008000 | 0X01010101 | 4 | 3 | 0X0309020C | 0X0705080C | 0X00080000 | 0XFF040000 |

*Fig. 4C*

| 496 | 431 COMP_COMP | TEMP STORAGE ROWS 470 | | | | 484 DESTC | 486 DESTPC | 488 SRCA | VECTOR ARGUMENTS 472 | | | |
|---|---|---|---|---|---|---|---|---|---|---|---|---|
| | | 476 ROW_MASK | 478 ROW_LOWACT | 480 ROW_RETAINED | 482 ROW_OBJECT | | | | 490 SRCB | 492 DEST | 494 DEST+1 |
| t | 0XFF040000 | 0X00FF0000 | 0X00080000 | 0X00008000 | 0X01010101 | 4 | 3 | 0X0309020C | 0X0705080C | 0X00080000 | 0XFF040000 |
| u | 0X00040000 | 0X00FF0000 | 0X00080000 | 0X00008000 | 0X01010101 | 4 | 3 | 0X0309020C | 0X0705080C | 0X00080000 | 0XFF040000 |
| v | 0X00040000 | 0X00040000 | 0X00080000 | 0X00008000 | 0X01010101 | 4 | 3 | 0X0309020C | 0X0705080C | 0X00080000 | 0XFF040000 |
| w.i | 0X00040000 | 0X00040000 | 0X00080000 | 0X00008000 | 0X01010101 | 4 | 3 | 0X0309020C | 0X0705080C | 0X00080000 | 0XFF040000 |
| w.ii | 0X00040000 | 0X00FF0000 | 0X0 | 0X00008000 | 0X01010101 | 4 | 3 | 0X0309020C | 0X0705080C | 0X00080000 | 0XFF040000 |
| w.iii | 0X0 | 0X00FF0000 | 0X0 | 0X00008000 | 0X01010101 | 4 | 3 | 0X0309020C | 0X0705080C | 0X00080000 | 0XFF040000 |
| w.iv | 0X0 | 0X00FF0000 | 0X0 | 0X00008000 | 0X01010101 | 4 | 3 | 0X0309020C | 0X0705080C | 0X00080000 | 0XFF040000 |
| w.v | 0X0 | 0X00FF0000 | 0X0 | 0X00008000 | 0X01010101 | 4 | 3 | 0X0309020C | 0X0705080C | 0X00080000 | 0XFF040000 |
| w.vi | 0X0 | 0X00FF0000 | 0X0 | 0X00008000 | 0X01010101 | 4 | 3 | 0X0309020C | 0X0705080C | 0X00080000 | 0XFF040000 |
| x | 0X0 | 0X00FF0000 | 0X0 | 0X00008000 | 0X01010101 | 4 | 3 | 0X0309020C | 0X0705080C | 0X00FF0000 | 0XFF040000 |
| y | 0X0 | 0X00FF0000 | 0X0 | 0X00008000 | 0X01010101 | 4 | 3 | 0X0309020C | 0X0705080C | 0X00FF0000 | 0XFF000000 |
| z | 0X0 | 0X00FF0000 | 0X0 | 0X00008000 | 0X01010101 | 4 | 3 | 0X0309020C | 0X0705080C | 0X00FF0000 | 0XFF000000 |

*Fig. 4C (continued)*

| | | 1244 | 1245 | 1256 | 1270 | 1271 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |
| 1275 → | | 1 | 0 | 1 | 0 | 1 |
| | | 1 | 1 | 1 | 1 | 0 |

| | | | | | | | | | | | |
|---|---|---|---|---|---|---|---|---|---|---|---|
| | FF | 0 | 0 | 0 | 0 | 0 | 0 | 1 | 1 | 1 | ← 1276 |
| | FT | 0 | 0 | 0 | 1 | 1 | 1 | 0 | 0 | 0 | ← 1277 |
| | TF | 0 | 0 | 1 | 0 | 0 | 1 | 0 | 0 | 1 | ← 1278 |
| | TT | 0 | 1 | 0 | 0 | 1 | 0 | 0 | 1 | 0 | ← 1279 |
| A | B | A | A*B | A*$\overline{B}$ | A+B | B | AXB | A+$\overline{B}$ | $\overline{AXB}$ | $\overline{B}$ | ← 1247 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | | ial
COMPARISON OPERATIONS IN MEMORY

PRIORITY INFORMATION

This application is a Continuation of U.S. application Ser. No. 14/716,079, filed May 19, 2015, which issues as U.S. Pat. No. 9,830,999 on Nov. 28, 2017, which claims the benefit of U.S. Provisional Application No. 62/008,004, filed Jun. 5, 2014, the contents of which are incorporated herein by reference.

TECHNICAL FIELD

The present disclosure relates generally to semiconductor memory apparatuses and methods, and more particularly, to apparatuses and methods related to performing comparison operations in a memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIG. 4A illustrates a table showing the states of memory cells of an array at a particular phase associated with performing a comparison operation in accordance with a number of embodiments of the present disclosure.

FIG. 4B illustrates a table showing the states of memory cells of an array at a particular phase associated with performing a comparison operation in accordance with a number of embodiments of the present disclosure.

FIG. 4C illustrates a table showing the states of memory cells of an array at a particular phase associated with performing a comparison operation in accordance with a number of embodiments of the present disclosure.

DETAILED DESCRIPTION

Figure 1:
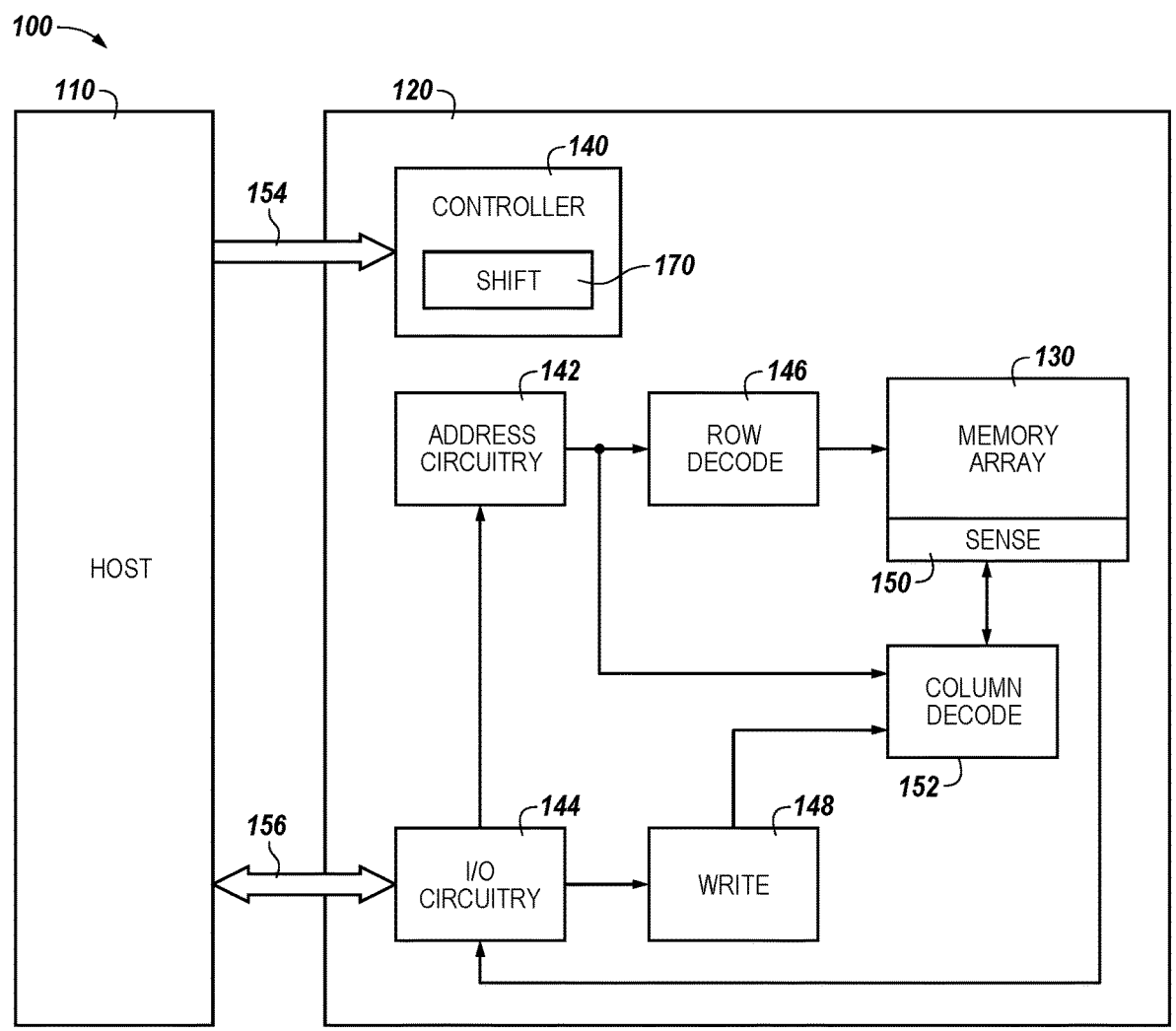
FIG. 1 is a block diagram of an apparatus in the form of a computing system including a memory device in accordance with a number of embodiments of the present disclosure.

The present disclosure includes apparatuses and methods related to performing comparison operations in a memory.

As used herein, a comparison operation includes comparing vectors. A comparison operation can be performed on a first element (e.g., first vector) and a second element (e.g., second vector). An element can be stored in a group memory cells coupled to an access line. For example, a first group of memory cells coupled to a first access line can be configured to store a first element. A second group of memory cells coupled to a second access line can be configured to store a second element. The comparison operation can compare the first element with the second element by performing a number of AND operations, OR operations, SHIFT operations, and INVERT operations without transferring data via an input/output (I/O) line.

As used herein, a first element and a second element can be numerical values that are compared to (e.g., against) each other. That is, a first value can be compared to a second value and/or the second value can be compared to the first value. A comparison operation can be used to determine whether the first value is greater than the second value, whether the second value is greater than the first value, and/or whether the first value is equal to the second value.

In a number of examples, an element can represent an object and/or other construct, which may be represented by a bit-vector. As an example, a comparison operation can be performed to compare objects by comparing the bit-vectors that represent the respective objects.

A number of embodiments of the present disclosure can provide a reduction of the number of computations and/or time involved in performing a number of comparison operations (e.g., compare functions) relative to previous approaches. For instance, the number of computations and/or the time can be reduced due to an ability to perform various portions of the number of comparison operations in parallel in throughput (e.g., simultaneously). Performing a number of comparison operations as described herein can also reduce power consumption as compared to previous approaches. In accordance with a number of embodiments, a comparison operation can be performed on elements (e.g., data in the form of bit-vectors stored in an array) without transferring data out of the memory array and/or sensing circuitry via a bus (e.g., data bus, address bus, control bus, etc.), which can reduce the time and/or power needed to transfer data to a host in order to perform the comparison operation. Also, the result from the comparison operation can be formatted as a two bit-vectors. The two bit-vectors can incorporate greater than and less than results. The two bit-vectors can be provided to other single instruction multiple data (SIMD) operations (e.g., bit-vector division) and/or advanced pattern search applications in the form of masks. A comparison operation can involve performing a number of logical operations (e.g., AND operations, OR operations, SHIFT operations, INVERT operations, and BLOCKOR operations etc.). However, embodiments are not limited to these examples. As used herein SIMD operations is defined as performing a same operation on multiple elements in parallel (e.g., simultaneously).

In various previous approaches, elements (e.g., a first data value and a second data value) to be compared may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single comparison function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a comparison operation, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "F," "M," "N," "P," "R," "S," "U," "V," "X," and "W," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 160 in accordance with a number of embodiments of the present disclosure. As used herein, a memory device 160, a memory array 130, and/or sensing circuitry 150 might also be separately considered an "apparatus."

System 100 includes a host 110 coupled to memory device 160, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 160 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIG. 2.

The memory device 160 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIG. 2. For instance, in a number of embodiments, the sensing circuitry 150 can comprise a number of sense amplifiers and a number of compute components, which may comprise an accumulator and can be used to perform logical operations (e.g., on data associated with complementary sense lines). In a number of embodiments, the sensing circuitry (e.g., 150) can be used to perform comparison operations using data stored in array 130 as inputs and store the results of the comparison operations back to the array 130 without transferring via a sense line address access (e.g., without firing a column decode signal). As such, a comparison function can be performed using sensing circuitry 150 rather than and/or in addition to being performed by processing resources external to the sensing circuitry 150 (e.g., by a processor associated with host 110 and/or other processing circuitry, such as ALU circuitry, located on device 160 (e.g., on control circuitry 140 or elsewhere)).

In various previous approaches, data associated with a comparison operation, for instance, would be read from memory via sensing circuitry and provided to an external ALU. The external ALU circuitry would perform the comparison functions using the elements (which may be referred to as operands or inputs) and the result could be transferred back to the array via the local I/O lines. In contrast, in a number of embodiments of the present disclosure, sensing circuitry (e.g., 150) is configured to perform a comparison operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the comparison function as the sensing circuitry 150 can perform the appropriate computations involved in performing the comparison function using the address space of memory array 130. Additionally, the comparison function can be performed without the use of an external processing resource.

Figure 2A:
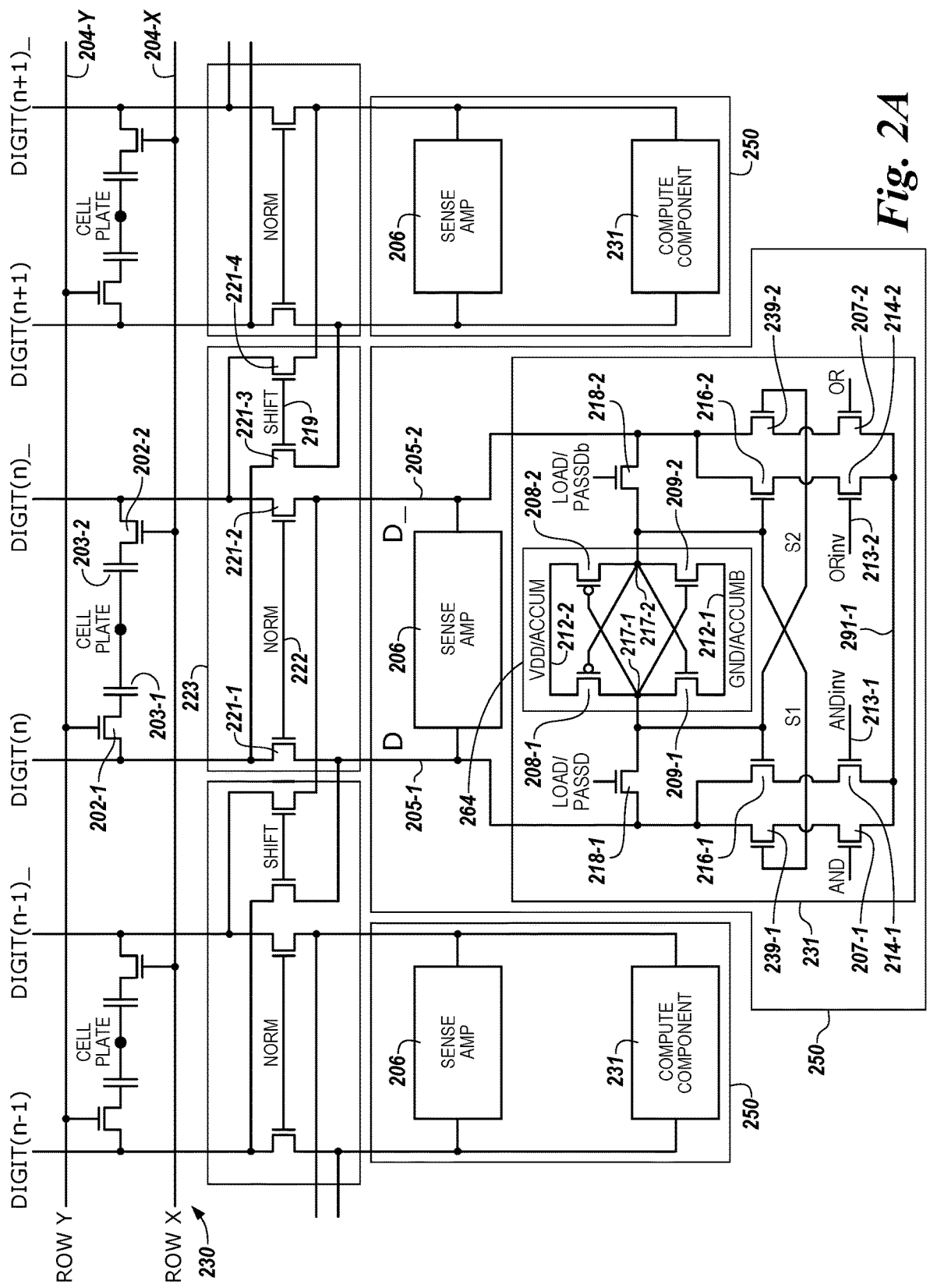
FIG. 2A illustrates a schematic diagram of a portion of a memory array in accordance with a number of embodiments of the present disclosure.

FIG. 2A illustrates a schematic diagram of a portion of a memory array 230 including sensing circuitry 250 in accordance with a number of embodiments of the present disclosure. In FIG. 2A, a memory cell comprises a storage element (e.g., capacitor) and an access device (e.g., transistor). For instance, transistor 202-1 and capacitor 203-1 comprises a memory cell, and transistor 202-2 and capacitor 203-2 comprises a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can comprise a cross coupled latch, which can be referred to herein as a primary latch. The sense amplifier 206 can be configured, for example, as described with respect to FIG. 2B.

In the example illustrated in FIG. 2A, the circuitry corresponding to compute component 231 comprises a static latch 264 and an additional ten transistors that implement, among other things, a dynamic latch. The dynamic latch and/or static latch of the compute component 231 can be collectively referred to herein as a secondary latch, which can serve as an accumulator. As such, the compute component 231 can operate as and/or be referred to herein as an accumulator. The compute component 231 can be coupled to each of the data lines D 205-1 and D_ 205-2 as shown in FIG. 2A. However, embodiments are not limited to this example. The transistors of compute component 231 can all be n-channel transistors (e.g., NMOS transistors), for example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage line 291-1 (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231 shown in FIG. 2A has the benefit of balancing the sense amplifier for functionality when the pull-down transistors 207-1, 207-2, 214-1, and 214-2 are conducting before the sense amplifier 206 is fired (e.g., during pre-seeding of the sense amplifier 206). As used herein, firing the sense amplifier 206 refers to enabling the sense amplifier 206 to set the primary latch and subsequently disabling the sense amplifier 206 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 2A is not contingent on the LOAD control signal being elevated to a voltage greater than $V_{DD}$.

According to some embodiments, the gate of load/pass transistor 218-1 can be coupled to a PASSD control signal, and the gate of load/pass transistor 218-2 can be coupled to a PASSDb control signal. In the configuration where the gates of transistors 218-1 and 218-2 are respectively coupled to one of the PASSD and PASSDb control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 223, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
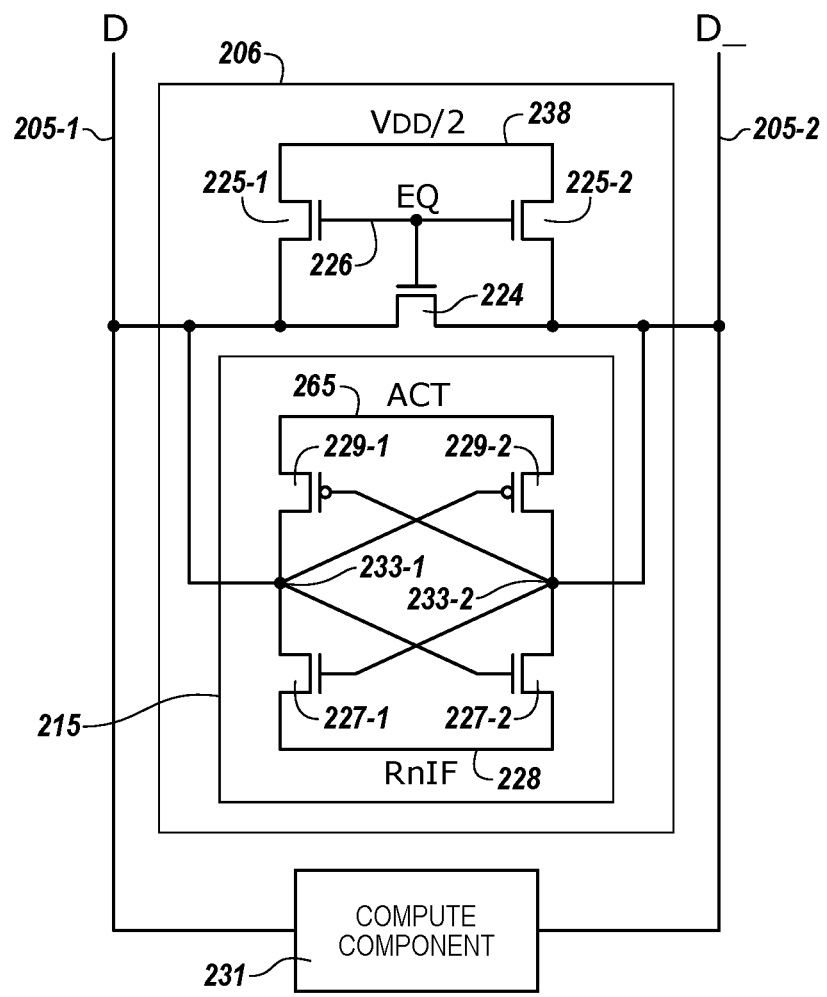
FIG. 2B illustrates a schematic diagram of a portion of a memory array in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

FIG. 2B illustrates a schematic diagram of a portion of a memory array in accordance with a number of embodiments of the present disclosure. According to various embodiments, sense amplifier 206 can comprise a cross coupled latch. However, embodiments of the sense amplifier 206 are not limited to the a cross coupled latch. As an example, the sense amplifier 206 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines D 205-1 and D_ 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 233 (e.g., accumulator) can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 2A, the sense amplifier 206 and the compute component 231 can be coupled to the array 230 via shift circuitry 223. In this example, the shift circuitry 223 comprises a pair of isolation devices (e.g., isolation transistors 221-1 and 221-2) coupled to data lines 205-1 (D) and 205-2 (D_), respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231 to a corresponding column of memory cells (e.g., to a corresponding pair of complementary data lines 205-1 (D) and 205-2 (D_). According to various embodiments, conduction of isolation transistors 221-1 and 221-2 can be referred to as a "normal" configuration of the shift circuitry 223.

In the example illustrated in FIG. 2A, the shift circuitry 223 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231 to another memory array (and isolate the particular sense amplifier 206 and compute component 231 from a first memory array). According to various embodiments, the shift circuitry 223 can be arranged as a portion of (e.g., within) the sense amplifier 206, for instance.

Although the shift circuitry 223 shown in FIG. 2A includes isolation transistors 221-1 and 221-2 used to couple particular sensing circuitry 250 (e.g., a particular sense amplifier 206 and corresponding compute component 231) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206 and compute components 231) in association with performing compute functions such as adding and subtracting functions without transferring data out of the sensing circuitry 250 via an I/O line (e.g., local I/O line (IO/IO_), for instance.

Although not shown in FIG. 2A, each column of memory cells can be coupled to a column decode line that can be activated to transfer, via local I/O line, a data value from a corresponding sense amplifier 206 and/or compute component 231 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform compute functions such as adding and subtracting functions without transferring data to a control component external to the array, for instance.

The sensing circuitry 250 can be operated in several modes to perform logical operations, including a first mode in which a result of the logical operation is initially stored in the sense amplifier 206, and a second mode in which a result of the logical operation is initially stored in the compute component 231. Operation of the sensing circuitry 250 in the first mode is described below with respect to FIGS. 3 and 4, and operation of the sensing circuitry 250 in the second mode is described below with respect to FIGS. 7-10. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

Figure 3:
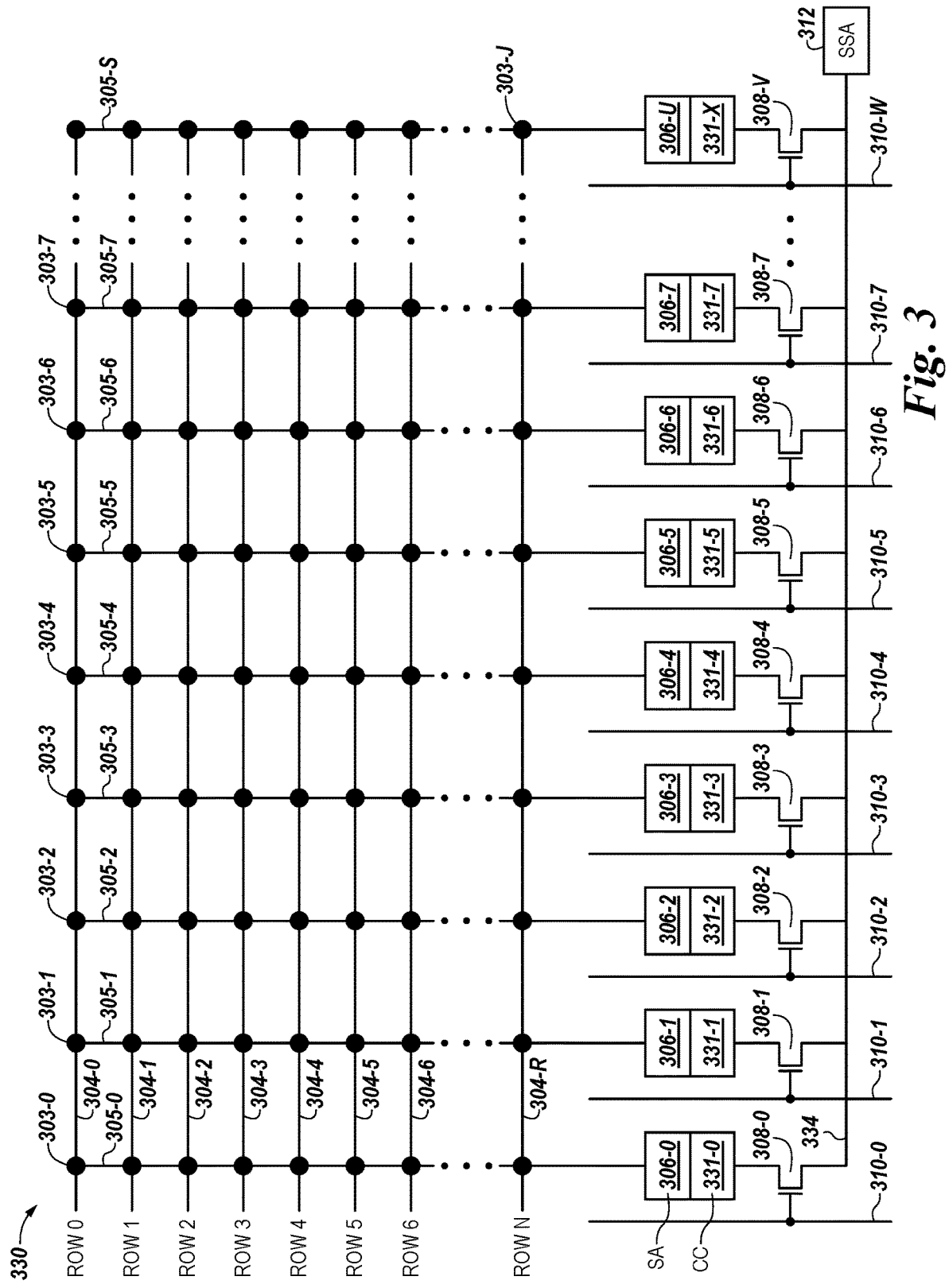
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells 303-0, 303-1, 303-3, 303-4, 303-5, 303-6, 303-7, 303-8, . . . , 303-J (e.g., referred to generally as memory cells 303), coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U (e.g., referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-2, 308-3, 308-4, 308-5, 308-6, 308-7, . . . , 308-V. In this example, the sensing circuitry also comprises a number of compute components 331-0, 331-2, 331-3, 331-4, 331-5, 331-6, 331-7, . . . , 331-X (e.g., referred to generally as compute components 331) coupled to the respective sense lines. Column decode lines 310-0 to 310-W are coupled to the gates of transistors 308-0 to 308-V, respectively, and can be selectively activated to transfer data sensed by respective sense amplifiers 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

The sensing circuitry (e.g., compute components 331 and sense amplifiers 306) is configured to perform a comparison operation in accordance with a number of embodiments described herein. The example given in FIGS. 4A, 4B, and 4C demonstrates how a comparison operation can be performed using data stored in array 330 as the inputs. The example involves using the elements (e.g., bits having logic "1" or logic "0") stored in the memory cells coupled to access lines 304-0 to 304-R and commonly coupled to sense lines 305-0 to 305-S as the respective inputs to the comparison operation. The result of the comparison operation can be stored in array 330 and/or can be transferred external to the array 330 (e.g., to functional unit circuitry of a host).

FIGS. 4A, 4B, and 4C illustrate a table showing the states of memory cells of an array at a number of particular phases associated with performing a comparison operation in accordance with a number of embodiments of the present disclosure. Column 496 of the table provides reference numbers (e.g., 1-8) for the rows of the table, and the reference numbers shown in the table correspond to the respective reference numbers of the pseudocode described below. The bit-vector values for each of the bit-vectors 476 (Row_Mask), 478 (Row_LowAct), 480 (Row_Retained), 482 (Row_Object), 488 (srca), 490 (srcb), 492 (dest), and 494 (dest+1) are stored in the array at various comparison operation phases corresponding to reference numbers 1-6.

The bit-vectors 476, 478, 480, and 482 can be stored in respective groups of memory cells coupled to particular access lines, which may be referred to as temporary storage rows 470 (e.g., rows that store data that may be updated during various phases of a comparison operation). The bit-vectors 488, 490, 492, and 494 can be referred to as vector arguments 472. FIGS. 4A-4C also indicate the bit-vector values for a bit-vector 431 (Comp_Comp) stored in compute components (e.g., 331 shown in FIG. 3) of the array.

The scalar integer variables 484 (destc) and 486 (destpc) can be stored in memory (e.g., registers) associated with control circuitry 140 in FIG. 1. In a number of examples, destc 484 and/or destpc 486 can also be stored in in the array 130 in FIG. 1.

In FIGS. 4A, 4B, and 4C the values of the bit-vectors corresponding to the rows 470 and/or the vector arguments 472 are shown in hexadecimal format although the corresponding bit-vectors operated on during the comparison operation can be stored as binary bit patterns in the array. For example, a srca bit-vector 488 (e.g., [0000 0011, 0000 1001, 0000 0010, 0000 1100] can be represented as [03, 09, 02, 0c] in hexadecimal format. The values shown in FIGS. 4A, 4B, and 4C are shown in hexadecimal format for ease of reference.

In the examples used herein, bit-vector values may include commas and/or spaces for ease of reference. For instance, a bit-vector represented in hexadecimal notation as [03, 09, 02, 0c] can correspond to four 8-bit wide vector elements, with the four elements separated by a respective comma and space. However, the same bit-vector can be represented as [03 09 02 0c] (e.g., without commas) and/or as [0309020c] (e.g., without commas and without spaces).

In FIGS. 4A, 4B, and 4C changes to the sensing circuitry that stores the bit-vectors corresponding to Comp_Comp 431, the memory cells that store the bit-vectors corresponding to the temporary storage rows 470 (e.g., Row_Mask 476, Row_LowAct 478, Row_Retained 480, and Row_Object 482), and the memory cells that store the bit-vectors corresponding to vector arguments 472 (e.g., srca 488, srcb 490, dest 492, and dest+1 494) are indicated in bold font. For example, at reference 1, srca 488, srcb 490, dest 492, and dest+1 494 are shown in bold font indicating values of the respective bit-vectors have changed during an operation phase to which the reference number corresponds. Changes to destc 484 and destpc 486 are also shown in bold font indicating changes to the memory in the control circuitry 140.

In the example shown in FIGS. 4A, 4B, and 4C, each of srca 488 (e.g., [0309020c]) and srcb 490 (e.g., [0705080c]) comprise four elements and are associated with four separate comparison operations.

For example, elements in a first element pair (e.g., 03 and 07 from srca 488 and srcb 490, respectively) are compared in a first comparison operation. Elements in a second element pair (e.g., 09 and 05 from srca 488 and srcb 490, respectively) are compared in a second comparison operation. Elements in a third element pair (e.g., 02 and 08 from srca 488 and srcb 490, respectively) are compared in a third comparison operation, and elements in a fourth element pair (e.g., 0c and 0c from srca 488 and srcb 490, respectively) are compared in a fourth comparison operation.

A first group of memory cells that store srca 488 can be cells coupled to a particular access line (e.g., 304-0 in FIG. 3) and to a number of sense lines (e.g., 305-0 to 305-31 in FIG. 3). The second group of memory cells that store srcb 490 can be cells coupled to a different particular access line (e.g., 304-1 in FIG. 3) and to a number of sense lines (e.g., 305-0 to 305-31 in FIG. 3).

The four elements of srca 488 can be stored in the first group of memory cells. For example, a first element (e.g., 03) of srca 488 can be stored in memory cells that are coupled to access line 304-0 and sense lines 305-0 to 305-7 in FIG. 3, a second element (e.g., 09) can be stored in memory cells that are coupled to access line 304-0 and sense lines 305-8 to 305-15 in FIG. 3, a third element (e.g., 02) can be stored in memory cells that are coupled to access line 304-0 and sense lines 305-16 to 305-23 in FIG. 3, and a fourth element (e.g., 0c) can be stored in memory cells that are coupled to access line 304-0 and sense lines 305-34 to 305-31 in FIG. 3.

The four elements of srcb 490 can be stored in the second group of memory cells. For example, a first element (e.g., 07) of srcb 490 can be stored in memory cells that are coupled to access line 304-1 and sense lines 305-0 to 305-7, a second element (e.g., 05) can be stored in memory cells that are coupled to access line 304-1 and sense lines 305-8 to 305-15, a third element (e.g., 08) can be stored in memory cells that are coupled to access line 304-1 and sense lines 305-16 to 305-23, and a fourth element (e.g., 0c) can be stored in memory cells that are coupled to access line 304-1 and sense lines 305-34 to 305-31.

Row_Mask 476, Row_LowAct 478, Row_Retained 480, and Row_Object 482 include bit-vectors that are stored in a plurality of groups of memory cells. For instance, Row_Mask 476, Row_LowAct 478, Row_Retained 480, and Row_Object 482 can be stored in memory cells that are coupled to respective access lines 304-2 to 304-5 and to sense lines 305-0 to 305-31. Destc 484 and destpc 486 include scalar integers that are used in the comparison operation.

In this example, the first element in srca 488 has a decimal value of 3, which can be represented by bit-vector [0000 0011] with 8-bit width. The particular bits of the bit-vector can be stored in the cells coupled to access line 304-0 and to the corresponding respective sense lines 305-0 to 305-7

(e.g., the most significant bit (MSB) of the bit-vector can be stored in the ROW 0 cell coupled to sense line 305-0, the next least significant bit (LSB) can be stored in the ROW 0 cell coupled to sense line 305-1, . . . , and the LSB can be stored in the ROW 0 cell coupled to sense line 305-7) in FIG. 3. Similarly, the first element in srcb 490 has a decimal value of 7, which can be represented by bit-vector [0000 0111], and the particular bits of the bit-vector can be stored in the cells coupled to access line 304-1 and to the corresponding respective sense lines 305-0 to 305-7. As such, the respective bits of the 8-bit wide bit-vectors representing the first element in srca 488 and the first element in srcb 490 can be stored in cells coupled to respective same sense lines (e.g., columns). That is, in this example, the MSBs of the bit-vectors are stored in cells coupled to sense line 305-0, the next least significant bits of the bit-vectors are stored in cells coupled to sense line, 305-1, etc. For simplicity, Endian Byte order is ignored. Rather, the bits in the logical word size are always in contiguous sequence with a least significant bit on the right to a most significant bit on the left.

However, embodiments are not limited to this example. For instance, elements to be compared in accordance with embodiments described herein can be represented by bit-vectors having a width other than 8-bits. Also, a plurality of elements can be represented by a particular bit-vector. For instance, a first 64-bit wide bit-vector could represent four elements each represented by a 16-bit wide bit-vector and could be stored in cells coupled to access line 304-0 (and to sense lines 305-0 to 305-63), and a second 64-bit wide bit-vector could represent four elements each represented by a 16-bit wide bit vector and could be stored in cells coupled to access line 304-1 (and to sense lines 305-0 to 305-63). The four elements represented by the first 64-bit wide bit-vector can be compared to the respective four elements represented by the second 64-bit wide bit-vector in accordance with embodiments described herein.

In a number of embodiments, the result of a comparison operation can be stored in a third group of memory cells, which can be cells coupled to a number of particular access lines (e.g., 304-0 to 304-R in FIG. 3). The third group of memory cells can be used to store a first bit-vector and/or a second bit-vector that indicates the result of the comparison operation. That is, the bit-vector(s) stored in the third group of memory cells can indicate whether the first element in srca 488 is greater than the first element in srcb 490, whether the first element in srcb 490 is greater than the first element in srca 488, and/or whether the first element in srca 488 is equal to the first element srcb 490. The third group of memory cells can, for example, be cells coupled to an access line 304-7 or cells coupled to at least one of access line 304-0 and access line 304-1. That is, the third group of memory cells can be a same group of memory cells as the first group of memory cells or the second group of memory cells. For instance, in the 8-bit wide bit-vector example above, the third group of memory cells can be cells coupled to access line 304-0 and to sense lines 305-0 to 305-7 and/or cells coupled to access line 304-1 and to sense lines 305-0 to 305-7.

The third group of memory cells can also comprise a first number of memory cells coupled to a particular access line and a second number of memory cells coupled to a different particular access line. The first and second numbers of memory cells can store two different bit-vectors that together indicate the results of the comparison operation (e.g., in a 2-bit horizontal vector row). For example, a first result bit-vector can be stored in the first number of memory cells and a second result bit-vector can be stored in the second number of memory cells. Particular bit patterns of the first and second result bit-vectors can indicate whether the first element in srca 488 is greater than the first element in srcb 490, whether the first element in srcb 490 is greater than the first element in srca 488, and/or whether the first element in srca 488 is equal to the first element in srcb 490.

For instance, as described further below, responsive to the first element in srca 488 being greater than the first element in srcb 490, the first result bit-vector can be a first bit pattern (e.g., [1111 1111]) and the second result bit-vector can be a second bit pattern (e.g., [0000 0000]), and responsive to the first element in srcb 490 being greater than the first element in srca 488, the first result bit-vector can be the second bit pattern (e.g., [0000 0000]) and the second result bit-vector can be the first bit pattern (e.g., [1111 1111]). Responsive to the first element in srcb 488 and the first element in srca 490 being equal, the first result bit-vector and the second result bit-vector can be the same bit pattern (e.g., [0000 0000] or [1111 1111]).

As an example, the first result bit-vector can be stored in the cells coupled to access line 304-2 and to sense lines 305-0 to 305-7 shown in FIG. 3. The second result bit-vector can be stored in the cells coupled to access line 304-3 and to the sense lines 305-0 to 305-7, for instance. In a number of examples, the first result bit-vector and/or the second result bit-vector can be stored in cells coupled to an access line to which cells storing the first and/or second elements being compared are coupled. For instance, if a first element is stored in a first group of cells coupled to access line 304-0 and a second element is stored in a second group of cells coupled to access line 304-1, a third group of cells storing the first and the second result bit-vectors may comprise cells coupled to access lines 304-0 and 304-1 in FIG. 3, respectively.

It is noted that a determination of whether a first element is greater than a second element may include a determination that the first element is not less than the second element, but may not identify whether the first element is equal to the second element. That is, if the first element is not greater than the second element, then the second element may be greater than the first element or the first element may be equal to the second element.

Accordingly, a comparison operation can also include a determination of whether the second element is greater than the first element, which may include a determination that the second element is not less than the first element. However, a determination that the second element is not less than the first element may not identify whether the second element is equal to the first element. In a number of examples, performing a comparison operation on a first element and a second element can include performing a number of AND operations, OR operations, SHIFT operations, and INVERT operations without transferring data via an input/output (I/O) line. The number of AND operations, OR operations, INVERT operations, and SHIFT operations can be performed using sensing circuitry on pitch with memory cells corresponding to respective columns of complementary sense lines.

The below pseudocode represents instructions executable to perform a number of comparison operations in a memory in accordance with a number of embodiments of the present disclosure. The example pseudocode is referenced using reference numbers 1-8, which correspond to the respective reference numbers 1-8 shown in column 496 of the table shown in FIGS. 4A, 4B, and 4C. For example, reference number one (1) corresponds to "Load srca, srcb" in the pseudocode, and reference number three (3) corresponds to "Obtain all Temp Rows" in the pseudocode.
1. Load srca, srcb.
2. Determine element count in sub array for the vector length.
3. Obtain all Temp Rows.
4. Find MSB and store in Comp_Comp, Row_Mask, Row_Retained.
5. Find MSB by shifting right with fixed vector for each length in Comp_Comp.
6. Right Shift for fixed length and store in Row_Object.
7. For each Vector element:
   7.a. Create Full Row_Mask for the element with bits enabled.
   7.b Right Shift Row_Retained to the fixed length of the element.
   7.c. Load srca in Comp_Comp
   7.d. Do Comp_Comp AND operation with srcb
   7.e. Store Inverse of Comp_Comp in Row_LowAct
   7.f. Load Row_LowAct in Comp_Comp
   7.g. Do Comp_Comp AND operation with srca
   7.h. Do Comp_Comp AND operation with Row_Mask
   7.i. Do Comp_Comp OR operation with dest
   7.j. Store Com_Comp in dest
   7.k. Load Row_LowAct in Comp_Comp
   7.1. Do Comp_Comp AND operation with srcb
   7.m. Do Comp_Comp AND operation with Row_Mask
   7.n. Do Comp_Comp OR operation with dest+1
   7.o. Store Comp_Comp in dest+1
   7.p. Load dest in Comp_Comp
   7.q. Do Comp_Comp AND operation with Row_Mask
   7.r. Store Comp_Comp in Row_LowAct
   7.s. For Vector fixed width:
     7.s.i. Do Comp_Comp AND operation with Row_Mask
     7.s.ii. Store Comp_Comp in Row_LowAct
     7.s.iii. Do Comp_Comp AND operation with Row_Object
     7.s.iv. Store return value of BLOCKOR operation into scalar integer destc
     7.s.v. Load Row_LowAct in Comp_Comp
     7.s.vi. Shift Right
   7.t. Load dest+1 in Comp_Comp
   7.u. Do Comp_Comp AND operation with Row_Mask
   7.v. Store Comp_Comp in Row_LowAct
   7.w. For Vector fixed width:
     7.w.i. Do Comp_Comp AND operation with Row_Mask
     7.w.ii. Store Comp_Comp in Row_LowAct
     7.w.iii. Do Comp_Comp AND operation with Row_Object
     7.w.iv. Store result value of BLOCKOR operation into scalar integer destpc
     7.w.v. Load Row_LowAct in Comp_Comp
     7.w.vi. Shift Right
   7.x. If destc>destpc
     7.x.i. Populate dest with Row_Mask
     7.x.ii. Populate dest+1 with Inverse Row_Mask
   7.y. else If destpc>destc
     7.y.i. Populate dest+1 with Row_Mask
     7.y.ii. Populate dest with Inverse Row_Mask
   7.z. else
     7.z.i. Populate dest and dest+1 with Inverse Row_Mask
8. Free all Temp Rows and return.

For purposes of discussion, the above pseudocode will be divided into a setup phase and a comparison phase. The pseudocode referenced by reference numbers 1-6 can correspond to the setup phase. In a number of embodiments, the setup phase can be performed simultaneously for all of the comparison operations. FIG. 4A illustrates the values of a number of bit-vectors associated with performing a comparison operation after the setup phase.

The pseudocode referenced by reference number 7 (e.g., 7.a-7.z.i) can correspond to the comparison phase. The comparison phase can further be divided into a determination phase and a results phase. The determination phase can correspond to the pseudocode reference by reference numbers 7.a. to 7.w.vi. The determination phase can be executed to determine whether the first element is greater than the second element in each of the element pairs, whether the second element is greater than the first element in each of the element pairs, and/or whether the first element is equal to the second element in each of the element pairs. The values of a number of bit-vectors during execution of an example comparison phase are shown in FIGS. 4B and 4C.

The pseudocode corresponding to the results phase can be executed to store the results of the comparison operation. The results phase can comprise the pseudocode referenced by reference numbers 7.x. to 7.z.i. In a number of examples, the results of the comparison operation can be stored in an array (e.g., array 330 in FIG. 3) without transferring data via an I/O line (e.g., I/O line 334). In a number of examples, the results of the comparison operation can be transferred to a location other than array 330 in FIG. 3.

The comparison phase can include performing a number of iterations of operations. For example, the pseudocode corresponding to reference number 7 (e.g., "For each Vector element:") can represent a "For" loop associated with iterating through a number of logical operations for each vector element pair of a number of vector element pairs being compared.

A first iteration of a "For" loop corresponding to reference number 7 can be performed to compare a first element to a second element of a first element pair, while subsequent iterations of the "For" loop can be performed to compare additional element pairs. In a number of examples, each iteration of the "For" loop corresponding to reference number 7 can be performed sequentially. Performing each iteration of the "For" loop sequentially can include concluding each iteration of the "For" loop before the next iteration of the "For" loop begins.

The pseudocode corresponding to reference number 1 (e.g., "Load srca, srcb") is associated with storing srca 488 and srcb 490 into the array 330 in FIG. 3. As described above, srca 488 and srcb 490 can each include a number of elements to be compared. At reference number 1, the bit-vector [0309020c] is stored in a group of memory cells that store srca 488, the bit-vector [0705080c] is stored in a group of memory cells that store srcb 490, the bit-vector [00000000] is stored in a plurality of groups of memory cells that store dest 492 and dest+1 494. At reference number 1, scalar integer 0 is stored in a register that stores destc 484 and destpc 486.

The pseudocode corresponding to reference number 2 (e.g., "Determine element count in sub array for the vector length"), is associated with determining the element count of srca 488 and srcb 490. Determining the count of elements in srca 488 and srcb 490 can include determining the number of element pairs to be compared. At reference number 2, a vector length is also determined. Although not shown in FIG. 4A, the element count and the vector length can be stored in the rows 470 that store temporary data. In FIGS. 4A, 4B, and 4C, the element count is four and the vector length is eight. The vector length is eight (8) because eight bits are used to represent each element in an element bit-vector. For example, the 03 element in hexadecimal is represented by the [0000 0011] bit-vector with eight bits.

As an example, the element count can be determined based on the width of srca 488 and srcb 490 and on the element width (e.g., the number of bits used to represent each element). Given that srca 488 and srcb 490 are each 32-bit wide bit-vectors (e.g., stored in memory cells that are coupled to 32 columns in memory) and that each element is represented by eight bits, each of srca 488 and srcb 490 comprise four elements (e.g., 32/8=4).

In a number of examples, the number of bits used to represent each element (e.g., the element width) can be a parameter provided by a host and/or user, for instance. Also, in a number of embodiments, the element count of srca 488 and/or srcb 490 and/or the vector width corresponding to srca 488 and srcb 490 can be provided by a host and/or user as a parameter. As such, in a number of examples, the element width of the bit-vectors comprising srca 488 and/or srcb 490 can be determined based on the vector width of srca 488 and srcb 490 and on the element count. For instance, given a vector width of 32 bits and an element count of 4, the element width would be 8 bits (e.g., 32/4=8).

The pseudocode referenced at reference number 3 (e.g., Obtain all Temp Rows) corresponds to initializing a number of groups of memory cells for use as temporary storage rows during a comparison operation. That is, the number of groups of memory cells can be groups of cells coupled to respective access lines (e.g., rows) and can be used to temporarily store data (e.g., as temporary storage) in association with performing the comparison operation. For example, a first group of memory cells can store a bit-vector referred to as "Row_Mask", a second group of memory cells can store a bit-vector referred to as "Row_LowAct", a third group of memory cells can store a bit-vector referred to as "Row_Retained", a fourth group of memory cells can store a bit-vector referred to as "Row_Object", a fifth group of memory cells can store a bit-vector referred to as "destc", and a sixth group of memory cells can store a bit-vector referred to as "destpc". Embodiments are not limited to a particular number of temporary storage rows. In a number of examples, each element pair that is being compared (e.g., a first element of srca and a first element of srcb) can be associated with a different number of bit-vectors corresponding to the rows that store Row_Mask 476, Row_LowAct 478, Row_Retained 480, Row_Object 482, destc 484, and/or destpc 486. In a number of examples, the bit-vectors corresponding to the rows that store temporary data are stored in memory cells coupled to the same sense lines as the element pairs that are being compared.

For instance, Row_Mask 476 can be used to identify and/or isolate elements that are being compared and/or bits of the bit-vectors corresponding to the elements that are being compared. Row_LowAct 478 can be used to identify the elements of srca 488 and srcb 490 that will be compared in the comparison operation. Row_Object 482 can be used to identify a least significant bit in each element. Destc 484 and destpc 486 can be used to identify the differences in srca 488 and srcb 490 (e.g., the respective bit positions having different binary values).

The groups of memory cells corresponding to temporary storage rows 470 may be oriented within memory 330 in a manner that facilitates performance of the comparison operation on the element pairs. For example, a plurality of groups of memory cells each storing the bit-vectors corresponding to respective temporary storage rows can be coupled to sense lines 305-0 to 305-31 in FIG. 3. Each group in the plurality of groups of memory cells can be coupled to a different access line (e.g., an access line having cells coupled thereto that are not used to store the bit-vectors corresponding to the elements being compared).

Initiating Row_Mask 476, Row_LowAct 478, Row_Retained 480, and Row_Object 482 can include storing the bit-vector [00000000] in the plurality of groups of memory cells that store Row_Mask 476, Row_LowAct 478, Row_Retained 480, and Row_Object 482.

The pseudocode referenced at reference number 4 (e.g., "Find MSB and store in Comp_Comp, Row_Mask, Row_Retained") is associated with determining the most significant bit (MSB) in srca 488 and/or srcb 490 and storing a bit-vector indicating the MSB in particular groups of memory cells. The bit pattern indicating the most significant bit can be stored (e.g., as a bit-vector) in a group of memory cells used to store Row_Mask 476 and in a group of memory cells used to store Row_Retained 480. The bit pattern indicating the most significant bit can also be stored (e.g., as a latched bit-vector) in sensing circuitry (e.g., compute components 331 and/or sense amplifiers 306 in FIG. 3). As an example, a bit pattern comprising a "1" in a MSB position and all "0s" in the remaining bit positions can be used to indicate the MSB of srca 488 and/or srcb 490. For example, if srca 488 and/or srcb 490 are 32-bit wide bit-vectors and are stored in memory cells coupled to sense lines 305-0 to 305-31, then the 32-bit wide binary bit-vector [1000 0000 0000 0000 0000 0000 0000 0000] (e.g., hexadecimal bit-vector [80000000]) can be used as the bit-vector indicating the MSB in srca 488 and/or srcb 490. In a number of examples, the compute components 331-0 to 331-32 in FIG. 3 can latch the respective bits of the bit-vector [1000 0000 0000 0000 0000 0000 0000 0000]. For example, the compute component 331-0 can latch a one (1) bit while the compute components 331-1 to 331-31 can latch zero (0) bits.

The pseudocode referenced at reference number 5 (e.g., Find MSB by shifting right with fixed vector for each length in Comp_Comp) is associated with determining a bit-vector that can indicate a MSB corresponding to each of a number of elements represented by srca 488 and/or srcb 490. The bit-vector used to indicate the MSBs corresponding to the number of elements can be determined by performing a number of logical operations (e.g., a number of iterations of SHIFT operations and OR operations) on the bit-vector stored in the compute components (e.g., 331-0 to 331-31 in FIG. 3) and a group of memory cells that store Row_Object 482 (e.g., whose corresponding bits can be stored in cells coupled to a particular temporary storage row and to respective sense lines 305-0 to 305-31). The SHIFT and OR iterations can result in a binary bit-vector [1000 0000, 1000 0000, 1000 0000, 1000 0000] (e.g., the hexadecimal bit-vector [80808080]) that comprises a "1" at the bit positions corresponding to the MSBs for each of the four elements represented by srca 488 and/or srcb 490. The SHIFT operations can be right SHIFT operations; however, embodiments are not limited to this example. The SHIFT operations can be performed on Comp_Comp 431. The OR operations can be performed on Row_Object 482 and Comp_Comp 431. The results of the SHIFT operations and the OR operations can be stored in a group of memory cells that store Row_Object 482 and the compute components (e.g., 331-0 to 331-31 in FIG. 3).

The pseudocode referenced at reference number 6 (e.g., Right Shift for fixed length and store in Row_Object) is associated with determining a bit-vector that can indicate a LSB corresponding to each of a number of elements represented by srca 488 and/or srcb 490. A number of SHIFT operations can be performed on Comp_Comp 431 (e.g., the result of the SHIFT and OR operations performed in reference number 5) to identify the LSB corresponding to each of the number of elements. For example, if a binary bit-vector [1000 0000, 1000 0000, 1000 0000] identifies a most significant bit for each element in srca 488 and/or srcb 490, then the bit-vector [000 0001, 0000 0001, 0000 0001] can identify the least significant bit for each bit-vector that represents an element in srca 488 and/or srcb 490. The least significant bit for each element in srca 488 bit-vector and/or srcb 490 can be identified by performing a right SHIFT operation a plurality of times equal to a vector length. The hexadecimal bit-vector [01010101] is stored in a group of memory cells that store Row_Object 482. The bit-vector [01010101] bit-vector identifies (e.g., with a "1") the least significant bit in each of the elements.

FIG. 4B illustrates a table showing the states of memory cells of an array at a particular phase associated with performing a comparison operation in accordance with a number of embodiments of the present disclosure. FIG. 4B includes rows 470 that store temporary data that include Row_Mask 476, Row_LowAct 478, Row_Retained 480, and Row_Object 482 that are analogous to the rows 470 that store temporary data, Row_Mask 476, Row_LowAct 478, Row_Retained 480, and Row_Object 482 in FIG. 4A. FIG. 4B includes Comp_Comp 431 that is analogous to Comp_Comp 431 in FIG. 4A. FIG. 4B also includes vector arguments 472 that are analogous to vector arguments 472 in FIG. 4A. The vector arguments 472 can include srca 488, srcb 490, dest 492, and/or a dest+1 bit-vector 494 that are analogous to vector arguments 472, srca 488, srcb 490, dest 492, and/or dest+1 494 in FIG. 4A. FIG. 4B includes scalar integers destc 484 and destpc 486 that are analogous to scalar integers destc 484 and destpc 486 in FIG. 4A. FIG. 4B shows the result of a number of instructions performed in a comparison stage.

The pseudocode referenced at reference number 7 (e.g., For each Vector element), corresponds to a "For" loop described via the pseudocode referenced at reference numbers 7.a to 7.z.i. As such, the "For" loop corresponding to reference number 7 involves performing a number of iterations of operations. Each iteration of operations of the number of iterations of operations corresponds to a particular element pair being compared. For instance, a first iteration of operations shown as pseudocode 7.a to 7.z.i is performed in association with comparing the first element pair, a second iteration of operations shown as pseudocode 7.a to 7.z.i is performed in association with comparing the second element pair, etc.

At reference number 7.a (e.g., Create Full Row_Mask for the element with bits enabled), a full row mask is created. A full row mask is defined as a mask that includes a specific bit pattern for a particular element and/or a particular plurality of elements. The specific bit pattern can include all ones (e.g, "1") or all zeros (e.g., "0"). For example, during a first iteration (e.g., an iteration corresponding to a first element pair) of the "For" loop associated with reference number 7.a, a binary bit-vector [1111 1111, 0000 0000, 0000 0000] (e.g., a hexadecimal bit-vector [ff000000]) is created and stored in a group of memory cells that store Row_Mask 476. Row_Mask 476 can be used to isolate an element in srca 488 and/or srcb 490 during a comparison operation. The bit-vector [ff000000] can also identify that a current comparison operation compares a first element from srca 488 and a first element from srcb 490. The full row mask can be created via a plurality of SHIFT operation that are performed on Row_Mask 476 and a plurality of OR operations that are performed on Comp_Comp 431 and Row_Mask 476.

At reference number 7.b (e.g., Right Shift Row_Retained to the fixed length of the element), Row_Retained 480 is stored in a group of compute components 331 in FIG. 3 (e.g., the Row_Retained bit-vector is read). That is Comp_Comp 431 can be equal to Row_Retained 480. A SHIFT operation can be performed on Comp_Comp 431 to identify the next element pair from srca 488 and srcb 490 that will be compared. For example, a right SHIFT operation can be performed on Row_Retained (e.g., binary bit-vector [1000 0000, 0000 0000, 0000 0000, 0000 0000]) that identifies that a first element pair from srca 488 and srcb 490 will be compared. The results of the right SHIFT operation (e.g., hexadecimal bit-vector [00800000]) can be stored in a third temporary group of memory cells that store Row_Retained 480.

At reference number 7.c (e.g., Load srca in Comp_Comp), srca 488 can be stored in sensing circuitry. For example, srca 488 (e.g., a hexadecimal bit-vector [0309020c]) can be stored in the compute components 331 and/or the sense amplifiers 306 in FIG. 3.

At reference number 7.d (e.g., Do Comp_Comp AND operation with srcb), an AND operation can be performed on Comp_Comp 431 and srcb 490 that is stored in a group of memory cells coupled to access line 304-1. The AND operation can be performed to identify common bits with a value equal to one (1) between Comp_Comp 431 (e.g., srca 488) and srcb 490. The result (e.g., a hexadecimal bit-vector [0301000c]) of the AND operation can be stored in the sensing circuitry (e.g., compute components 331 and/or sense amplifier 306).

At reference number 7.e (e.g., Store Inverse of Comp_Comp in Row_LowAct), an INVERT operation can be performed on Comp_Comp 431 (e.g., hexidecimal bit-vector [0301000c] which is the results of the previous AND operation) to identify bits that are not shared between srca 488 and srcb 490. The result (e.g., bit-vector [fcfefff3]) of the INVERT operation can be stored in the group of memory cells that store Row_LowAct 478.

At reference number 7.f (e.g., Load Row_LowAct in Comp_Comp), Row_LowAct 478 (e.g., a bit-vector [fcfefff3]) is stored in the sensing circuitry. At reference number 7.g (e.g., Do Comp_Comp AND operation with srca), an AND operation is performed on Comp_Comp 431 (e.g., Row_LowAct 478) and srca 488. The AND operation can be performed on Comp_Comp 431 (e.g., a bit-vector [fcfefff3]) and srca 488 (e.g., a bit-vector [0309020c]) to identifies indexes of bits in srca 488 that have a value of one (1) and associated bits in srcb 490 that have a value of zero (0). The result (e.g., a bit-vector [00080200]) of the AND operation is stored in the sensing circuitry. The result identifies that a bit with an index, (e.g., given that a first index identifies a least significant bit) equal to four (4) in a second element in srca 488 has a one (1) value and that a bit with an index equal to four (4) in an associated element in srcb 490 has a zero (0) value. The result also identifies that a bit with an index, (e.g., given that a first index identifies a least significant bit) equal to two (2) in a third element in srca 488 has a one (1) value and that a bit with an index equal to two (2) in an associated element in srcb 490 has a zero (0) value. The results of the AND logical operation can be stored in the sensing circuitry.

At reference number 7.h (e.g., Do Comp_Comp AND operation with Row_Mask), an AND operation is performed on Comp_Comp 431 (e.g., a hexadecimal bit-vector [00080200]) and on Row_Mask 476 (e.g., a bit-vector [ff000000]) to isolate the identified indexes that are associated with a current comparison operation. The results (e.g., a bit-vector [00000000] bit-vector) of the AND operation can be stored in the sensing circuitry.

At reference number 7.i (e.g., Do Comp_Comp OR operation with dest), an OR operation is performed on Comp_Comp 431 (e.g., a hexadecimal bit-vector [00000000]) and dest 792 (e.g., a bit-vector [00000000]). The result (e.g., a bit-vector [00000000]) of the OR operation is stored in the sensing circuitry. At reference number 7.j (e.g., Store Comp_Comp in dest), Comp_Comp 431 (e.g., a bit-vector [00000000]) is stored in a group of memory cells that store dest 492.

At reference number 7.k (e.g., Load Row_LowAct in Comp_Comp), Row_LowAct 478 (e.g., a bit-vector [fcfefff3]) is stored in the sensing circuitry. At reference number 7.1 (e.g., Do Comp_Comp AND operation with srcb), an AND operation is performed on a Comp_Comp 431 (e.g., a bit-vector [fcfefff3]) and on srcb 490 (e.g., a bit-vector [0705080c]). The AND operation is performed to identify indexes of bits in srcb 490 that have a value of one (1) and associated bits in srca 488 that have a value of zero (0). The result (e.g., a bit-vector [04040800]) is stored in the sensing circuitry.

At reference number 7.m (e.g., Do Comp_Comp AND operation with Row_Mask), an AND operation is performed on Comp_Comp 431 (e.g., a bit-vector [04040800]) and on Row_Mask 476 (e.g., a bit-vector [ff000000]) to isolate the identified indexes that are associated with a current comparison operation. The result (e.g., a bit-vector [04000000]) is stored in the sensing circuitry. At reference number 7.n (e.g., Do Comp_Comp OR operation with dest+1), an OR operation is performed on Comp_Comp 431 (e.g., a bit-vector [04000000]) and dest+1 494 (e.g., a bit-vector [00000000]). At reference number 7.o (e.g., Store Comp_Comp in dest+1), the result (e.g., a bit-vector [04000000]) of the OR operation is stored in the group of memory cells that store dest+1 494.

At reference number 7.p (e.g., Load dest in Comp_Comp), dest 492 (e.g., a bit-vector [00000000]) is stored in the sensing circuitry. At reference number 7.q (e.g., Do Comp_Comp AND operation with Row_Mask), an AND operation is performed on Comp_Comp 431 (e.g., a bit-vector [00000000]) and Row_Mask 476 (e.g., a bit-vector [FF000000]) to isolate the bits in Comp_Comp 431 that are associated with the current compare operation. The result of the AND operation is stored in the sensing circuitry. At reference number 7.r (e.g., Store Comp_Comp in Row_LowAct), Comp_Comp 431 (e.g., a bit-vector [00000000]) is stored in the group of memory cells that store Row_LowAct 478.

At reference number 7.s (For Vector fixed width), a "For" loop is executed. The "For" loop iterates through the indexes associated with an element width. A number of operations are performed (e.g., operations associated with reference number 7.s.i. to 7.s.vi.) for each index. The "For" loop iterations through the indexes associated with an element width. For example, if an element is represented by a bit-vector with eight bits (e.g., element width), then the "For" loop can iterate eight times, each iteration incrementing the index by one. During a first iteration of the "For" loop an index will have a value of one (1), during a second iteration of the "For" loop an index will have a value of two (2), . . . , and during an eight iteration of the "For" loop an index will have a value of eight (8). The "For" loop will conclude (e.g., break) after the eighth iteration.

At reference number 7.s.i (e.g., Do Comp_Comp AND operation with Row_Mask), an AND operation is performed on Comp_Comp (e.g., a bit-vector [00000000]) and Row_Mask 476 (e.g., a bit-vector [ff000000]). The results (e.g., a bit-vector [00000000]) of the AND operation is stored in the sensing circuitry. At reference number 7.s.ii (e.g., Store Comp_Comp in Row_LowAct), Comp_Comp 431 (e.g., a bit-vector [00000000]) is stored in the group of memory cells that store Row_LowAct 478.

At reference number 7.s.iii. (Do Comp_Comp AND operation with Row_Object), an AND operation is performed on Comp_Comp 431 (e.g., a bit-vector [00000000]) and on Row_Object 482 (e.g., a bit-vector [01010101]). The result (e.g., a bit-vector [00000000]) of the AND operation is stored in the sensing circuitry.

At reference number 7.s.iv. (e.g., Store return value of BLOCKOR operation into scalar integer destc), a BLOCKOR operation is performed on Comp_Comp 431. The result (e.g., [00000000]) of the BLOCKOR operation is stored in memory that is associated with the control circuitry and that store destc 484. As used herein, the BLOCKOR operation can be performed to determine whether one or more bits of a bit-vector stored in the sensing circuitry are a particular value (e.g., whether any of the bits stored in the sensing circuitry are a one "1" bit). The BLOCKOR operation can be performed using an I/O line 334 and a secondary sense amplifier 312.

The BLOCKOR operation is performed to determine a most significant bit index of bits in srca 488 that have a value of one (1) and associated bits in srcb 490 that have a value of zero (0). The result of the BLOCKOR operation is stored as an scalar integer memory that is associated with control circuitry and that stores destc 484. The BLOCKOR operation is performed on the bits of Comp_Comp that are associated with a number of indexes. The number of indexes are indexes that the "For" loop in reference number 7.s iterates. For example, the BLOCKOR operation is performed during each iteration of the "For" loop referenced in reference number 7.s and is only performed on the iterated indexes of the "For" loop. For example, during a first iteration of the "For" loop referenced in reference number 7.s the BLOCKOR operation is performed on the least significant bit in Comp_Comp 431. During the second iteration of the "For" loop reference in reference number 7.s the BLOCKOR operation is performed on two least significant bits (e.g., bits with an index equal to zero (0) and one (1) in Comp_Comp 431). During an eighth iteration of the "For" loop referenced in reference number 7.s the BLOCKOR operation is performed on all the bits in Comp_Comp 431.

In a number of embodiments, a BLOCKOR operation can be performed in association with determining if the memory cells coupled to one or more (e.g., any) particular sense line store a data pattern that matches the target data pattern. For example, knowing whether one or more matches to the target data pattern are stored in an array may be useful information, even without knowing which particular sense line(s) is coupled to cells storing the matching data pattern. In such instances, the determination of whether any of the sense lines are coupled to cells storing a match of the target data pattern can include charging (e.g., precharging) a local I/O line (e.g., local I/O line 334) coupled to a secondary sense amplifier (e.g., 312) to a particular voltage. The I/O line (e.g., 334) can be precharged via control circuitry such as control circuitry 140 shown in FIG. 1 and/or sensing circuitry such as circuitry 150 shown in FIG. 1, for instance, to a voltage such as a supply voltage (e.g., Vcc) or a ground voltage (e.g., 0V).

In performing a BLOCKOR operation (which may be referred to as an "AccumulatorBlockOr"), the column decode lines (e.g., 310-1 to 310-W) coupled to the selected sensing circuitry (e.g., sense amplifiers 306 and/or compute components 331) can be activated in parallel (e.g., such that respective transistors 308-1 to 308-V are turned on) in order to transfer the voltages of the components of the sensing circuitry (e.g., sense amplifiers 306 and/or compute components 331) to the local I/O line (e.g., 334). The secondary sense amplifier (e.g., SSA 314) can sense whether the precharged voltage of the local I/O line changes (e.g., by more than a threshold amount) responsive to activation of the column decode lines.

For instance, if the I/O line 234 is precharged to a ground voltage and one or more of the selected compute components (e.g., 331-1 to 331-X) stores a logic 1 (e.g., 0V) to represent a match, then the SSA 312 can sense a pull up (e.g., increase) of the voltage on I/O line 334 to determine whether any stored data pattern matches the target data pattern (e.g., whether at least one of the accumulators stores a "1"). Alternatively, if the I/O line 334 is precharged to Vcc and one or more of the selected sensing circuitry components (e.g., accumulators) stores a logic 0 (e.g., Vcc) to represent a match, then the SSA 312 can sense a pull down (e.g., decrease) of the voltage on I/O line 334 to determine whether any stored data pattern matches the target data pattern (e.g., whether at least one of the accumulators stores a "0").

In a number of examples, the determination of whether the sensing circuitry coupled to selected column decode lines stores a particular data value (e.g., a match data value of "1") is effectively performing a logic "OR" operation. In this manner, voltages corresponding to data stored in sensing circuitry can be transferred, in parallel, to the local I/O line 334 and sensed by SSA 312 as part of a BLOCKOR operation. Embodiments of the present disclosure are not limited to particular precharge voltages of local I/O line 334 and/or to particular voltage values corresponding to logic 1 or logic 0.

At reference number 7.s.v (Load Row_LowAct in Comp_Comp), Row_LowAct 478 is stored in the sensing circuitry. At reference number 7.s.vi (Shift Right), a SHIFT operation is performed on Comp_Comp 431 (e.g., a bit-vector [00000000]). The SHIFT operation can be a right SHIFT operation. The results of the SHIFT operation are stored in the sensing circuitry.

At reference number 7.t (Load dest+1 in Comp_Comp), dest+1 494 is stored in the sensing circuitry. At reference number 7.u (e.g., Do Comp_Comp AND operation with Row_Mask), an AND operation is performed on Comp_Comp (e.g., a bit-vector [04000000]) 431 and Row_Mask 476 (e.g., a bit-vector [ff000000]). The result [04000000] is stored in the sensing circuitry. At reference number 7.v (e.g., Store Comp_Comp in Row_LowAct), Comp_Comp 431 (e.g., a bit-vector [04000000]) is stored in the group of memory cells that store Row_LowAct 478.

At reference number 7.w (e.g., For Vector fixed width), a "For" loop is performed. The "For" loop referenced in reference number 7.w is analogous to the "For" loop referenced in reference number 7.s. Reference numbers 7.w.i to 7.w.iii are also analogous to reference numbers 7.s.i to 7.s.iii.

At reference number 7.w.i (e.g., Do Comp_Comp AND operation with Row_Mask), an AND operation is performed on Comp_Comp 431 (e.g., the bit-vector [04000000]) and Row_Mask 476 (e.g., the bit-vector [ff000000]). The result (e.g., [04000000]) of the AND operation is stored in the sensing circuitry. At reference number 7.w.ii (e.g., Store Comp_Comp in Row_LowAct), the result of the AND operation is stored in the group of memory cells that store Row_LowAct 478.

At reference number 7.w.iii (e.g., Do Comp_Comp AND operation with Row_Object), an AND operation is performed on Comp_Comp 431 (e.g., a bit-vector [04000000]) and Row_Object 482 (e.g., e.g., a bit-vector [01010101]). The result (e.g., [01000000]) of the AND operation is stored in the sensing circuitry.

At reference number 7.w.iv (e.g., Store result value of BLOCKOR operation into scalar integer destpc), a BLOCKOR operation is performed on Comp_Comp 431 (e.g., a bit-vector [01000000]). The result (e.g., 3) of the BLOCKOR operation is stored in the group of memory cells that store destpc 486.

At reference number 7.w.v (e.g., Load Row_LowAct in Comp_Comp), Row_LowAct 478 is stored in the sensing circuitry. At reference number 7.w.vi (e.g., Shift Right), A SHIFT operation is performed on Comp_Comp 431 (e.g., a bit-vector [01000000]). The result (e.g., a bit-vector [00000000]) of the SHIFT operation is stored in the sensing circuitry.

At reference number 7.x (e.g., if destc>destpc), it is determined that destc 484 (e.g., a bit-vector [0]) is not greater than destpc 486 (e.g., a bit-vector [3]). If destc 484 were greater than destpc 486, then a number of operations referenced in reference numbers 7.x.i to 7.x.ii would be performed.

For example, at reference number 7.x.i (e.g., Populate dest with Row_Mask), dest 492 is stored in the sensing circuitry. An OR operation is performed on Comp_Comp 431 and Row_Mask 476. The result of the OR operation is stored in the group of memory cells that store dest 492.

At reference number 7.x.ii (e.g., Populate dest+1 with Inverse Row_Mask), an INVERT operation is performed on Row_Mask 476. The result of the INVERT operation is stored in the sensing circuitry. An AND operation is performed on Comp_Comp 431 and dest+1 494. The result of the AND operation is stored in the group of memory cells that store dest+1 494.

At reference number 7.y (e.g., else If destpc>destc), it is determined that destpc 486 (e.g., a scalar integer 3) is greater than destc 484 (e.g., a scalar integer 0). A number of operations referenced in reference numbers 7.y.i to 7.y.ii are performed based on the determination that destpc 486 is greater than destc 484.

At reference number 7.y.i (Populate dest+1 with Row_Mask), dest+1 494 is stored in the sensing circuitry. An OR operation is performed on dest+1 494 and Row_Mask 476. The result (e.g., a bit-vector [ff000000]) of the OR operation is stored in the group of memory cells that store dest+1 494 to update dest+1 494.

At reference number 7.y.ii (Populate dest with Inverse Row_Mask), an INVERToperation is performed on Row_Mask 476. An AND operation is performed on Comp_Comp 431 and dest 492. The result (e.g., a bit-vector [00000000]) of the AND operation is stored in the group of memory cells that store dest 492 to update dest 492. The bold font used in the above bit-vectors describe the portion of the bit-vector (e.g., dest 492 and/or dest+1 494) that is updated.

The bit-vector [ff000000] (e.g., dest+1 494) indicates that the first element in srcb 490 is greater than the first element in srca 488. The bits that are associated with "ff" in dest+1 494 have a number of indexes. The indexes can identify associated elements in srca 488 and srcb 490 that form an element pair. The "ff" in dest+1 494 indicates the identified element in srcb 490 is greater than the identified element in srca 488. The [00000000] dest bit-vector 492 indicates that the first element in srca 488 can be less than the first element in srcb 490 or equal to the first element in srcb 490.

At reference number 7.z (e.g., else), it is determined whether destc 484 is not equal to destpc 486 and whether destpc 486 is not equal to destc 484. That is, at reference number 7.z it is determined whether destc 484 is equal to destpc 486. If destc 484 is equal to destpc 486, then a number of operations are performed at reference number 7.z.i. The number of operations can include performing an INVERT operation on Row_Mask 476 and storing the result of the INVERT operation in the sensing circuitry. The number of operations can also include performing an AND operation on Comp_Comp 431 and dest 492. The result of the AND operation can be stored in the group of memory cells that store dest 492. The number of operations can also include performing an AND operation on Comp_Comp 431 and dest+1 494. The result of the AND operation can be stored in the group of memory cells that store dest+1 494.

FIG. 4C illustrates a table showing the states of memory cells of an array at a particular phase associated with performing a comparison operation in accordance with a number of embodiments of the present disclosure. FIG. 4C includes rows 470 that store temporary data that include Row_Mask 476, Row_LowAct 478, Row_Retained 480, and Row_Object 482 that are analogous to the rows 470 that store temporary data, Row_Mask 476, Row_LowAct 478, Row_Retained 480 and Row_Object 482 in FIGS. 4A 4B. FIG. 4C includes the Comp_Comp 431 that are analogous to Comp_Comp 431 in FIG. 4A and FIG. 4B. FIG. 4C also includes vector arguments 472 that are analogous to vector arguments 472 in FIGS. 4A and 4B. The vector arguments 472 can include srca 488, srcb 490, dest 492, and/or dest+1 494 that are analogous to vector arguments 472, srca 488, srcb 490, dest 492, and/or dest 494 in FIGS. 4A and 4B. FIG. 4c also includes scalar integers destc 484, and/or destpc 486 that are analogous to scalar integers destc 484 and dest pc 486 in FIGS. 4A and 4B.

FIG. 4C shows the state of a number of memory cells during a comparison phase that follows the comparison phase in FIG. 4B. That is, FIG. 4C shows the state of the number of memory cells during a second iteration of the "For" loop referenced in reference number 7.

At reference number 7.a, a bit-vector [00ff0000] is created. The bit-vector [00ff0000] in a group of memory cells that store Row_Mask 476. The Row_Mask 476 (e.g., the bit-vector [00ff0000]) identifies that a current comparison operation compares a second element from srca 488 and a second element from srcb 490.

At reference number 7.b, a [00008000] bit-vector is stored in the sensing circuitry and is stored in a group of memory cells that store Row_Retained 480. The bit-vector [00008000] identifies the next elements that are to be compared in a subsequent iteration of the "For" loop referenced in reference number 7.

At reference number 7.c, srca 488 is stored in the sensing circuitry. At reference number 7.d the result (e.g., [0301000c]) of an AND operation performed on srca 488 and srcb 490 is stored in the sensing circuitry.

At reference number 7.e, an INVERT operation is performed on the bit-vector [0301000c]. The result of the INVERT operation is a bit-vector [fcfefff3]. The [fcfefff3] bit-vector is stored in a group of memory cells that store Row_LowAct 478. At reference number 7.f., the bit-vector [fcfefff3] (e.g., Row_LowAct 478) is stored in the sensing circuitry. At reference number 7.g., an AND operation is performed on Comp_Comp 431 (e.g., a bit-vector [fcfefff3]) and srca 488 (e.g., a bit-vector [0309020c]). The result (e.g., a bit-vector [00080200]) of is stored in the sensing circuitry.

At reference number 7.h, an AND operation is performed on Comp_Comp (e.g., a bit-vector [00080200]) and on Row_Mask 476 (e.g., a bit-vector [00ff0000]). The result (e.g., a bit-vector [00080000]) is stored in the sensing circuitry. At reference number 7.i, an OR operation is performed on Comp_Comp 431 (e.g., a bit-vector [00080000]) and dest 492 (e.g., a bit-vector [00000000]). The result (e.g., a bit-vector [00080000]) of the OR operation is stored in the sensing circuitry.

At reference number 7.j, the result (e.g., a bit-vector [00080000]) of the OR operation is stored in the group of memory cells that store dest 492. At reference number 7.k, Row_LowAct 478 (e.g., a bit-vector [fcfefff3]) is stored in the sensing circuitry. At reference number 7.1, an AND operation is performed on Comp_Comp 431 (e.g., a bit-vector [fcfefff3]) and on srcb 490 (e.g., a bit-vector [0705080c]). The result (e.g., a bit-vector [04040800]) is stored in the sensing circuitry.

At reference number 7.m, an AND operation is performed on the bit-vector [04040800] (e.g., Comp_Comp 431) and bit-vector [00ff0000] (e.g., Row_Mask 476). The result (e.g., a bit-vector [00040000]) is stored in the sensing circuitry. At reference number 7.n, an OR operation is performed on the bit-vector [00040000] (e.g., Comp_Comp 431) and the bit-vector [ff000000] (e.g., dest+1 494). At reference number 7.o, the result (e.g., a bit-vector [ff040000]) is stored in dest+1 494.

At reference number 7.p, dest 492 (e.g., [00080000]) is stored in the sensing circuitry. At reference number 7.q, an AND operation is performed on the bit-vector [00080000] (e.g., Comp_Comp 431) and a bit-vector [00ff0000] (e.g., Row_Mask 476). At reference number 7.r, the result (e.g., a bit-vector [00080000]) of the AND operation is stored in the group of memory cells that store Row_LowAct 478.

At reference number 7.s, a "For" loop is performed. The "For" loop increments a bit index after each iteration. The index begins with a one value and is incremented until the "For" loop breaks. The "For" loop continues while the index is less or equal to the element width. Reference numbers 7.s.i to 7.s.vi show a state of a number of memory cells after the last iteration of the "For" loop.

At reference number 7.s.i., an AND operation is performed on a bit-vector [00080000] (e.g., Comp_Comp 431) and a bit-vector [000ff000] (e.g., Row_Mask 476). The result (e.g., a bit-vector [00080000]) of the AND operation is stored in the sensing circuitry. At reference number 7.s.ii., the results of the AND operation are stored in the group of memory cells that store Row_LowAct 478.

At reference number 7.s.iii, an AND operation is performed on the bit-vector [00080000] (e.g., Comp_Comp 431) and a bit-vector [01010101] (e.g., Row_Object 482). The result (e.g., a bit-vector [00000000]) is stored in the sensing circuitry. At reference number 7.s.iv, a BLOCKOR operation is performed on Comp_Comp 431. The result (e.g., 4) of the BLOCKOR operation is stored memory that is associated with control circuitry and that stores destc 484.

At reference number 7.s.v, Row_LowAct 478 is stored in sensing circuitry. At reference number 7.s.vi., a SHIFT operation is performed on the bit-vector [00080000] (e.g., Comp_Comp 431). The result of the SHIFT operation is stored in the sensing circuitry.

At reference number 7.t, a bit-vector [ff040000] (e.g., dest+1 494] is stored in the sensing circuitry. At reference number 7.u, an AND operation is performed on a bit-vector

[ff040000] (e.g., Comp_Comp 431) and the bit-vector [00ff0000] (e.g., Row_Mask 476). The result (e.g., a bit-vector [00040000]) is stored in the sensing circuitry. At reference number 7.v, the result (e.g., a bit-vector [00040000]) is stored in the group of memory cells that store Row_LowAct 478.

Reference numbers 7.w.i to 7.w.vi reference a number of operations performed in a "For" loop (e.g., 7.w). At reference number 7.w.i, an AND operation is performed on the bit-vector [00040000] (e.g., Comp_Comp) and a bit-vector [00ff0000] (e.g., Row_Mask 476). The result (e.g., a bit-vector [00040000]) of the AND operation is stored in the sensing circuitry 431. At reference number 7.w.ii, the result (e.g., a bit-vector [00040000]) of the AND operation is stored in the group of memory cells that store Row_LowAct 478. At reference number 7.w.iii., an AND operation is performed on the bit-vector [00040000] (e.g., Comp_Comp) and a bit-vector [01010101] (e.g., Row_Object 482). The result (e.g., [00000000]) of the AND operation is stored in the sensing circuitry. At reference number 7.w.iv, a BLOCKOR operation is performed on a bit-vector [00000000](e.g., Comp_Comp). The result (e.g., 3) of the BLOCKOR operation is stored in memory that is associated with control circuitry and that stores destpc 486. At reference number 7.w.v, Row_LowAct 478 is stored in the sensing circuitry. At reference number 7.w.vi, A SHIFT operation (e.g., a right SHIFT operation) is performed on the bit-vector [00000000] (e.g., Comp_Comp). The result (e.g., a bit-vector [00000000]) of the SHIFT operation is stored in the sensing circuitry.

At reference number 7.x, it is determined that destc 484 (e.g., [4]) is greater than destpc 486 (e.g., [3]). At reference number 7.x.i, a bit-vector [00080000] (e.g., dest 492) is stored in the sensing circuitry and an OR operation is performed on the bit-vector [00080000] (e.g., Comp_Comp 431) and a bit-vector [00ff0000] (e.g., Row_Mask 476). As a result (e.g., a bit-vector [00ff0000]) is stored in a group of memory cells that store dest 492. That is, dest 492 is updated (e.g., [00ff0000]). At reference number 7.x.ii, an INVERT operation is performed on the bit-vector [00ff0000]. The results (e.g., a bit-vector [ff00ffff]) is stored in the sensing circuitry. An AND operation is performed on the bit-vector [ff00ffff] (e.g., Comp_Comp 431) and a bit-vector [ff040000] (e.g., dest+1 494). The result (e.g., a bit-vector [ff000000]) is stored in the group of memory cells that store dest+1 494. That is, dest+1 494 is updated. The bit-vector [00ff0000] (e.g., dest 492) indicates that the second element in srca 488 is greater than the second element in srcb 490. The bit-vector [ff000000] dest+1 494 indicates that the second element in srcb 490 is less than or equal to the second element in srca 488.

At reference number 7.y, it is determined that destpc 486 is not greater than destc 484. At reference number 7.z, it is determined that destc 484 is not equal to destpc 486.

The final two iteration of the "For" loop referenced in reference number 7 are not shown. After a third iteration of the "For" loop, dest 492 has a value equal to a bit-vector [00ff0000] and dest+1 494 has a value equal to the bit-vector [ff00ff00]. That is, dest+1 494 indicates that the third element in srcb 490 is greater than the third element in srca 488.

After a fourth iteration of the "For" loop reference in reference number 7, dest 492 has a value equal to the bit-vector [00ff0000] and dest+1 494 has a value equal to the bit-vector [ff00ff00]. That is, dest 492 and dest+1 494 together indicate that the fourth element in srca 488 is equal to the fourth element in srcb 490. The "00" bits with a same index in both dest+1 494 and dest 492 indicate that the corresponding elements from srcb 490 and srca 488 are equal.

At reference number 8, the memory cells that store Row_Mask 476, Row_LowAct 478, Row_Retained 480, Row_Object 482, srca 488, and/or srcb 490 can be released. As used herein, releasing memory cells can make the memory cells available for storing data that is associated with a different instance of a comparison operation and/or logical operations not associated with a comparison operation.

Embodiments however, are not limited to the order of the sequence of instructions in the pseudocode in this example. For example, a number of operations reference in reference numbers 7.t. to 7.w.vi. can be performed before a number of operations reference in reference numbers 7.p. to 7.s.vi. are performed.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 (D) and/or 205-2 (D_).

Figure 5:
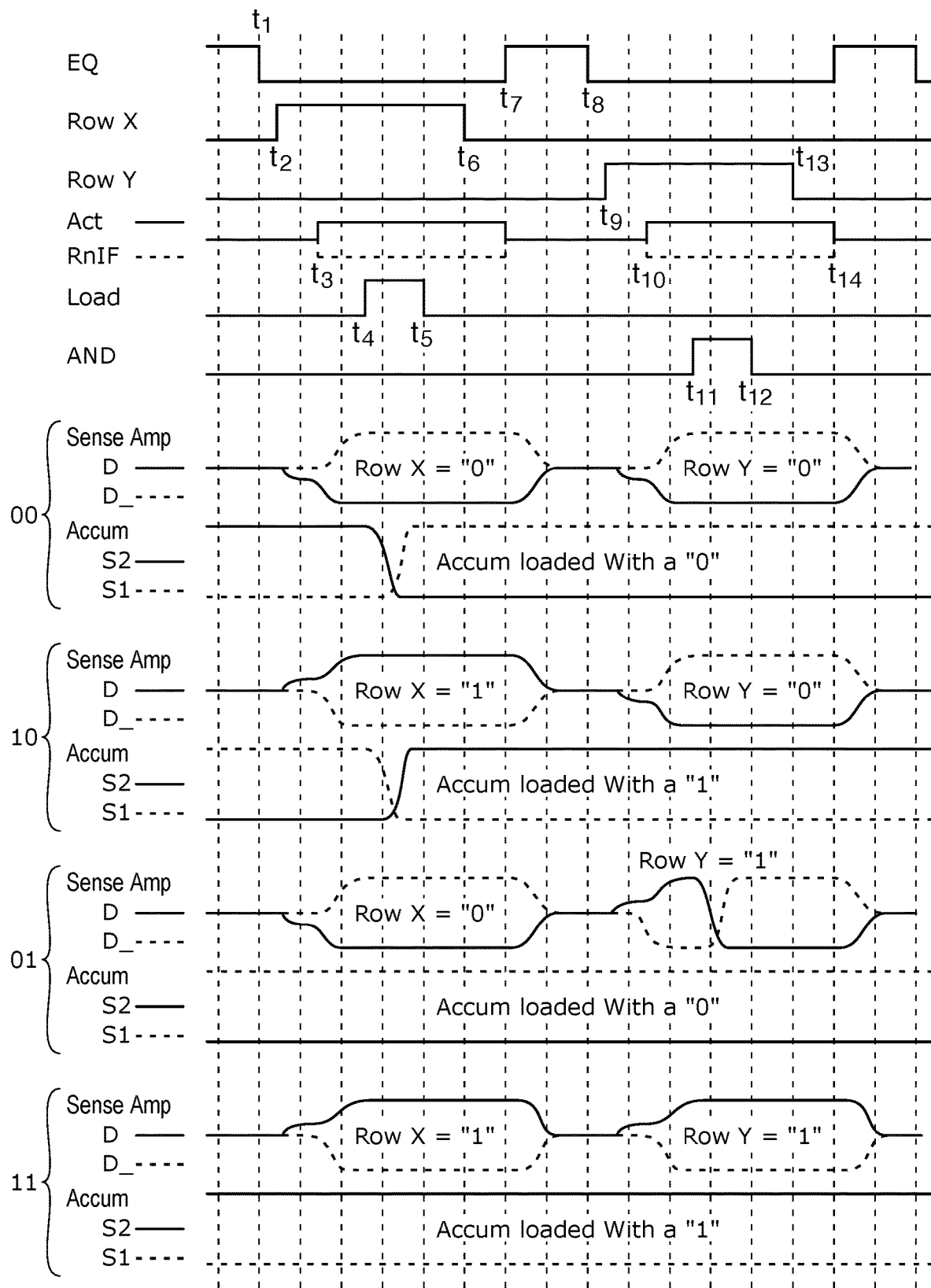
FIG. 5 illustrates a timing diagram associated with performing a number of logical operations using sensing circuitry in accordance with a number of embodiments of the present disclosure.

FIG. 5 illustrates a timing diagram associated with performing a number of logical operations using sensing circuitry in accordance with a number of embodiments of the present disclosure. FIG. 5 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 5 illustrates a number of control signals associated with operating sensing circuitry (e.g., 250) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 5 also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:

Copy Row X into the Accumulator:
Deactivate EQ
Open Row X
Fire Sense Amps (after which Row X data resides in the sense amps)
Activate LOAD (sense amplifier data (Row X) is transferred to nodes S1 and S2 of the Accumulator and resides there dynamically)
Deactivate LOAD
Close Row X
Precharge In the pseudo code above, "Deactivate EQ" indicates that an equilibration signal (EQ signal shown in FIG. 5) corresponding to the sense amplifier 206 is disabled at $t_1$ as shown in FIG. 5 (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 5. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled (e.g., activated), in the pseudo code above, "Fire Sense Amps" indicates that the sense amplifier 206 is enabled to set the primary latch and subsequently disabled. For example, as shown at $t_3$ in FIG. 5, the ACT positive control signal (e.g., 265 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 5 (e.g., one for each combination of Row X and Row Y data values) shows the behavior of signals on data lines D and D_. The Row X data value is stored in the primary latch of the sense amp. It should be noted that FIG. 2A shows that the memory cell including storage element 202-2, corresponding to Row X, is coupled to the complementary data line D_, while the memory cell including storage element 202-1, corresponding to Row Y, is coupled to data line D. However, as can be seen in FIG. 2A, the charge stored in memory cell 202-2 (corresponding to Row X) corresponding to a "0" data value causes the voltage on data line D_ (to which memory cell 202-2 is coupled) to go high and the charge stored in memory cell 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 5, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 5, the behavior at inputs of the secondary latch of the accumulator indicates the secondary latch is loaded with the Row X data value. As shown in FIG. 5, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_), in the pseudo code above, "Deactivate LOAD" indicates that the LOAD control signal goes back low as shown at $t_5$ in FIG. 5 to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 5, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 5 by the EQ signal going high at $t_7$. As shown in each of the four sets of possible sense amplifier and accumulator signals illustrated in FIG. 5 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

Deactivate EQ
Open Row Y
Fire Sense Amps (after which Row Y data resides in the sense amps)
Close Row Y
 The result of the logic operation, in the next operation, will be placed on the sense amp, which will overwrite any row that is active.
 Even when Row Y is closed, the sense amplifier still contains the Row Y data value.
Activate AND
 This results in the sense amplifier being written to the value of the function (e.g., Row X AND Row Y)
 If the accumulator contains a "0" (i.e., a voltage corresponding to a "0" on node S2 and a voltage corresponding to a "1" on node S1), the sense amplifier data is written to a "0"
 If the accumulator contains a "1" (i.e., a voltage corresponding to a "1" on node S2 and a voltage corresponding to a "0" on node S1), the sense amplifier data remains unchanged (Row Y data)
 This operation leaves the data in the accumulator unchanged.
Deactivate AND
Precharge In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 5 at $t_8$. After equilibration is disabled, a selected row (e.g., ROW Y) is enabled as indicated in the pseudo code above by "Open Row Y" and shown in FIG. 5 at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_). As shown at $t_{10}$ in FIG. 5, the ACT positive control signal (e.g., 265 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 5 shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 5 at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at t12 in FIG. 5, causing pass transistor 207-1 to stop conducting to isolate the sense amplifier 206 (and data line 205-1 (D)) from ground. If not previously done, Row Y can be closed (as shown at t13 in FIG. 5) and the sense amplifier can be disabled (as shown at $t_{14}$ in FIG. 5 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 5).

FIG. 5 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S1 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 5 and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6:
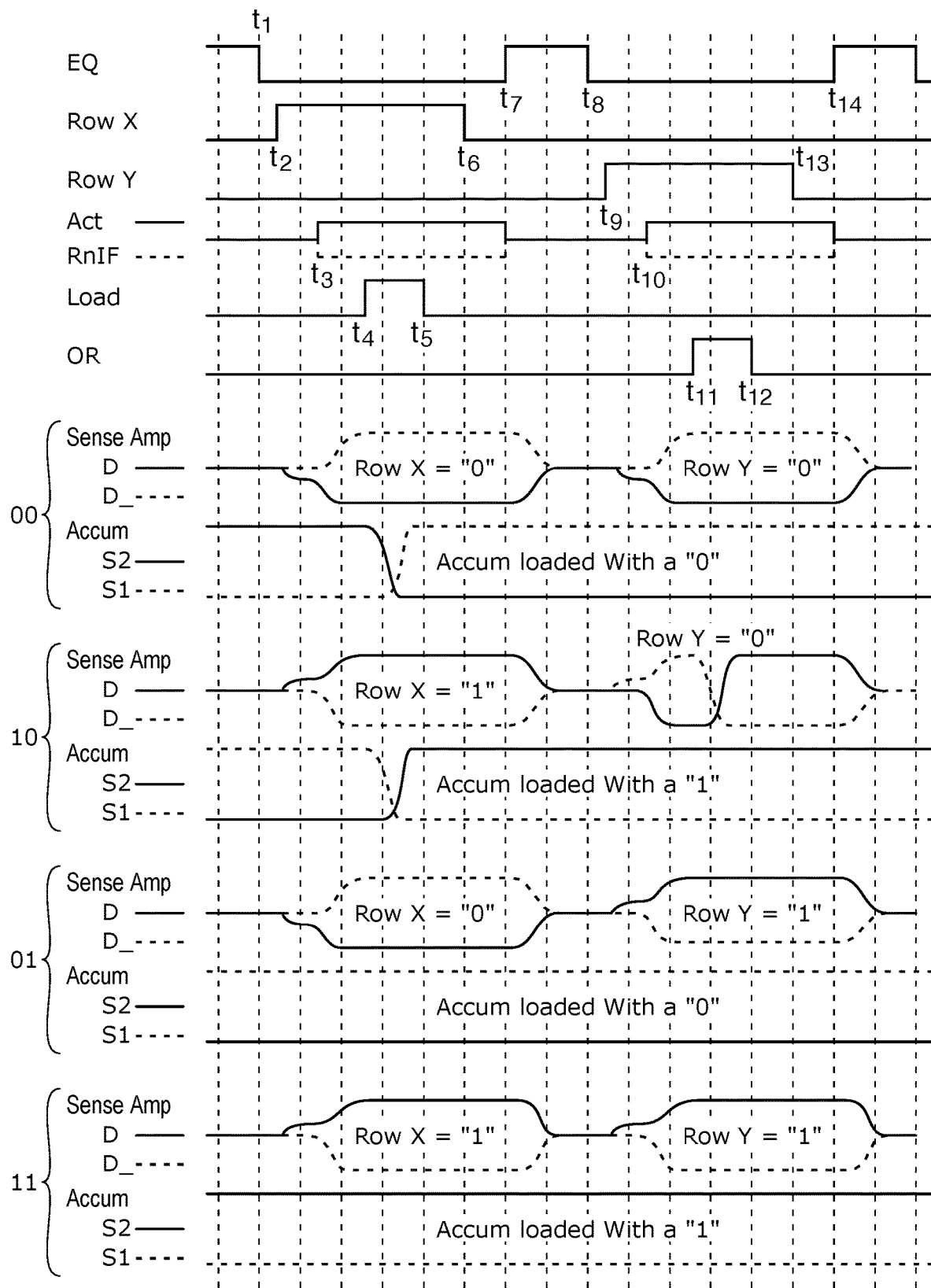
FIG. 6 illustrates a timing diagram associated with performing a number of logical operations using sensing circuitry in accordance with a number of embodiments of the present disclosure.

FIG. 6 illustrates a timing diagram associated with performing a number of logical operations using sensing circuitry in accordance with a number of embodiments of the present disclosure. FIG. 6 illustrates a timing diagram associated with initiating an OR logical operation after starting to load the second operand (e.g., Row Y data value) into the sense amplifier. FIG. 6 illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and accumulator that were previously described with respect to times $t_1$-$t_7$ shown in FIG. 5 are not repeated with respect to FIG. 6. Example pseudo code associated with "ORing" the data values can include:

Deactivate EQ
Open Row Y
Fire Sense Amps (after which Row Y data resides in the sense amps)
Close Row Y
When Row Y is closed, the sense amplifier still contains the Row Y data value.
Activate OR
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data)
If the accumulator contains a "1" (i.e., a voltage corresponding to a "1" on node S2 and a voltage corresponding to a "0" on node S1), the sense amplifier data is written to a "1"
This operation leaves the data in the accumulator unchanged.
Deactivate OR
Precharge The "Deactivate EQ" (shown at $t_8$ in FIG. 6), "Open Row Y" (shown at $t_9$ in FIG. 6), "Fire Sense Amps" (shown at $t_{10}$ in FIG. 6), and "Close Row Y" (shown at t13 in FIG. 6, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 6 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at t12 in FIG. 6, causing pass transistor 207-2 to stop conducting to isolate the sense amplifier 206 (and data line D 205-2) from ground. If not previously done, Row Y can be closed (as shown at t13 in FIG. 6) and the sense amplifier can be disabled (as shown at $t_{14}$ in FIG. 6 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

Copy Row X into the Accumulator
Deactivate EQ
Open Row X
Fire Sense Amps (after which Row X data resides in the sense amps)
Activate LOAD (sense amplifier data (Row X) is transferred to nodes S1 and S2 of the Accumulator and resides there dynamically
Deactivate LOAD
Activate ANDinv and ORinv (which puts the compliment data value on the data lines)
 This results in the data value in the sense amplifier being inverted (e.g., the sense amplifier latch is flipped)
 This operation leaves the data in the accumulator unchanged
Deactivate ANDinv and ORinv
Close Row X
Precharge The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a compliment version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift
Deactivate EQ
Open Row X
Fire Sense Amps (after which shifted Row X data resides in the sense amps)
Activate Norm and Deactivate Shift
Close Row X
Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above. Operations to shift left Row X can be summarized as follows:

Activate Norm and Deactivate Shift
Deactivate EQ
Open Row X
Fire Sense Amps (after which Row X data resides in the sense amps)
Deactivate Norm and Activate Shift
Sense amplifier data (shifted left Row X) is transferred to Row X
Close Row X
Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 7:
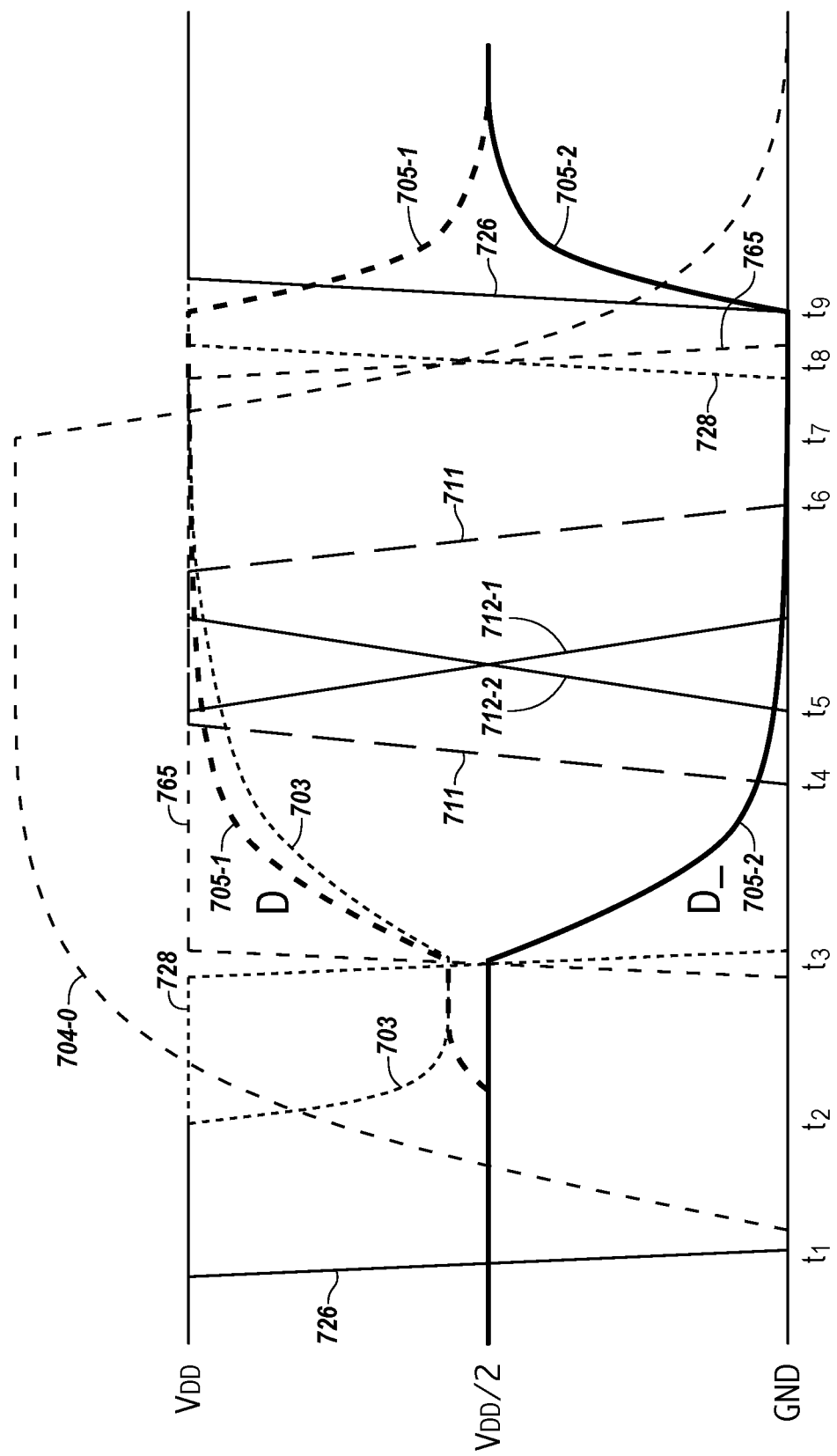
FIG. 7 illustrates a timing diagram associated with performing a number of logical operations using sensing circuitry in accordance with a number of embodiments of the present disclosure.

FIG. 7 illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 7 illustrates signals (e.g., voltage signals) associated with performing a first operation phase of a logical operation (e.g., an R-input logical operation) using the sensing circuitry illustrated in FIG. 2A. The first operation phase described with respect to FIG. 7 can be a first operation phase of an AND, NAND, OR, or NOR operation, for instance. Performing the operation phase illustrated in FIG. 7 can involve consuming significantly less energy (e.g., about half) than previous processing approaches that may involve providing a full swing between voltage rails (e.g., between a supply and ground).

In the example illustrated in FIG. 7, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 7 do not necessarily represent a same absolute or relative time as similar time references in other timing diagrams.

t time $t_1$, the equilibration signal 726 is deactivated, and then a selected row is enabled (e.g., the row corresponding to a memory cell whose data value is to be sensed and used as a first input). Signal 704-0 represents the voltage signal applied to the selected row (e.g., Row Y 204-Y shown in FIG. 2A). When row signal 704-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 705-1 and 705-2 on the data lines, respectively) between times $t_2$ and $t_3$. The voltage of the selected cell is represented by signal 703. Due to conservation of energy, creating the differential signal between data lines D and D_ (e.g., by coupling the cell to data line D) does not consume energy, since the energy associated with enabling/disabling the row signal 704-0 can be amortized over the plurality of memory cells coupled to the row.

At time $t_3$, the sense amplifier (e.g., 206 shown in FIG. 2A) is activated (e.g., a positive control signal 765 (e.g., corresponding to ACT 265 shown in FIG. 2B) goes high and the negative control signal 728 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 7 shows, in example, the data line voltages 705-1 and 705-2 that correspond to a logic "1" being on data line D.

According to some embodiments, the primary latch of sense amplifier 206 can be coupled to the complementary data lines D and D_ through respective pass transistors (not shown in FIG. 2B but in a similar configuration as the manner in which latch 264 is coupled to the data lines D and D_ through load/pass transistors 218-1 and 218-2 shown in FIG. 2A). The Passd control signal 711 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 711 applied to control lines coupled to the respective gates of the pass transistors going high). At time $t_5$, the accumulator positive control signal 712-1 (e.g., Accumb) and the accumulator positive control signal 712-2 (e.g., Accum) are activated via respective control lines 212-1 and 212-2 shown in FIG. 2A. As described below, the accumulator control signals ACCUMB 712-1 and ACCUM 712-2 may remain activated for subsequent operation phases. As such, in this example, activating the control signals ACCUMB 712-1 and ACCUM 712-2 enables the secondary latch (e.g., accumulator) of compute component 231-6 shown in FIG. 2A. The sensed data value stored in sense amplifier 206 is transferred (e.g., copied) to the secondary latch, including the dynamic latch and latch 264.

At time $t_6$, the Passd control signal 711 (and the Passdb control signal) goes low thereby turning off the pass transistors (if present). However, since the accumulator control signals ACCUMB 712-1 and ACCUM 712-2 remain activated, an accumulated result is stored (e.g., latched) in the secondary latches (e.g., accumulator). At time $t_7$, the row signal 704-0 is deactivated, and the array sense amps are disabled at time $t_8$ (e.g., sense amplifier control signals 728 and 765 are deactivated).

At time $t_9$, the data lines D and D_ are equilibrated (e.g., equilibration signal 726 is activated), as illustrated by data line voltage signals 705-1 and 705-2 moving from their respective rail values to the equilibration voltage ($V_{DD}/2$). The equilibration consumes little energy due to the law of conservation of energy. As described below in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 8:
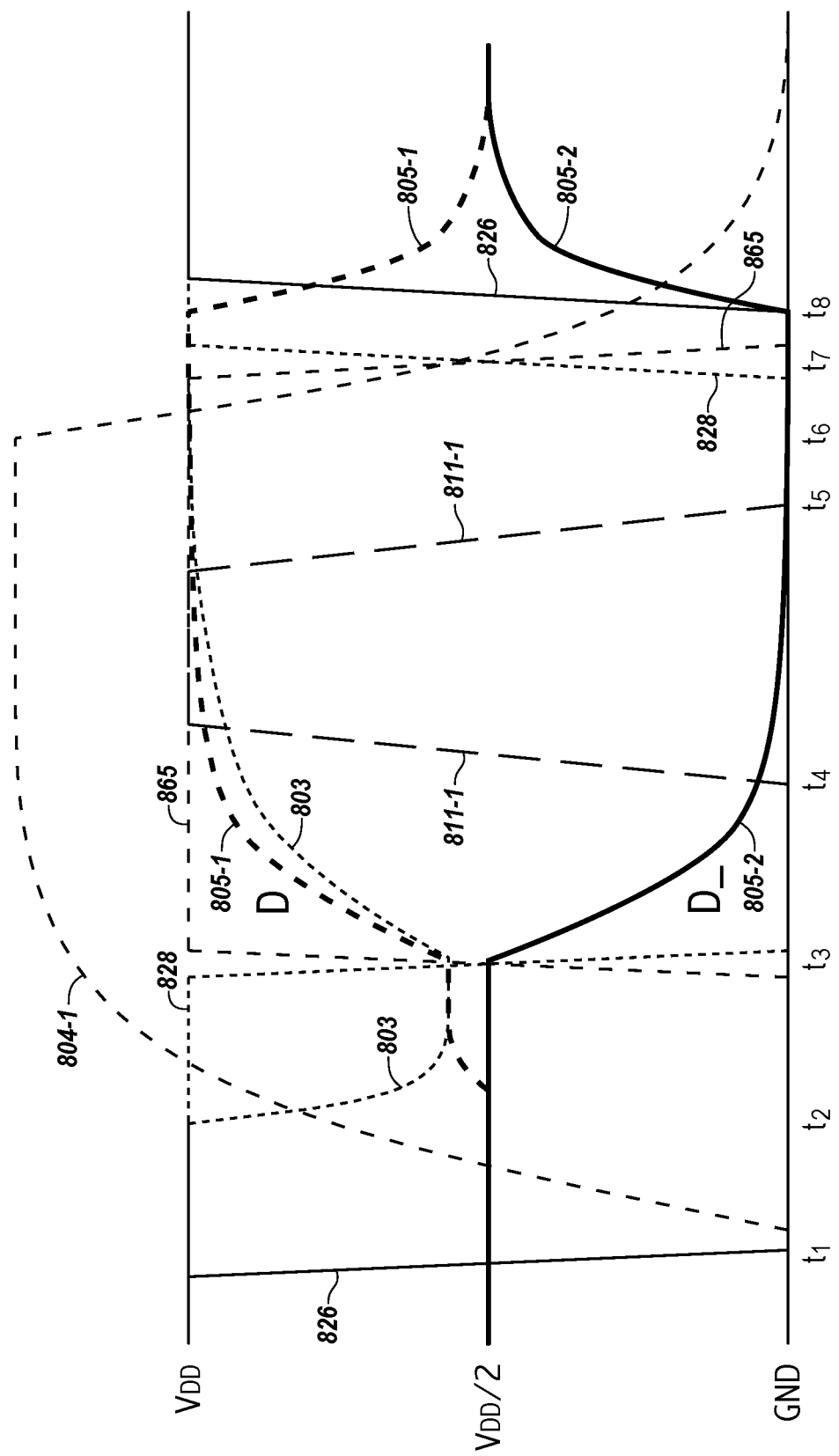
FIG. 8 illustrates a timing diagram associated with performing a number of logical operations using sensing circuitry in accordance with a number of embodiments of the present disclosure.
Figure 9:
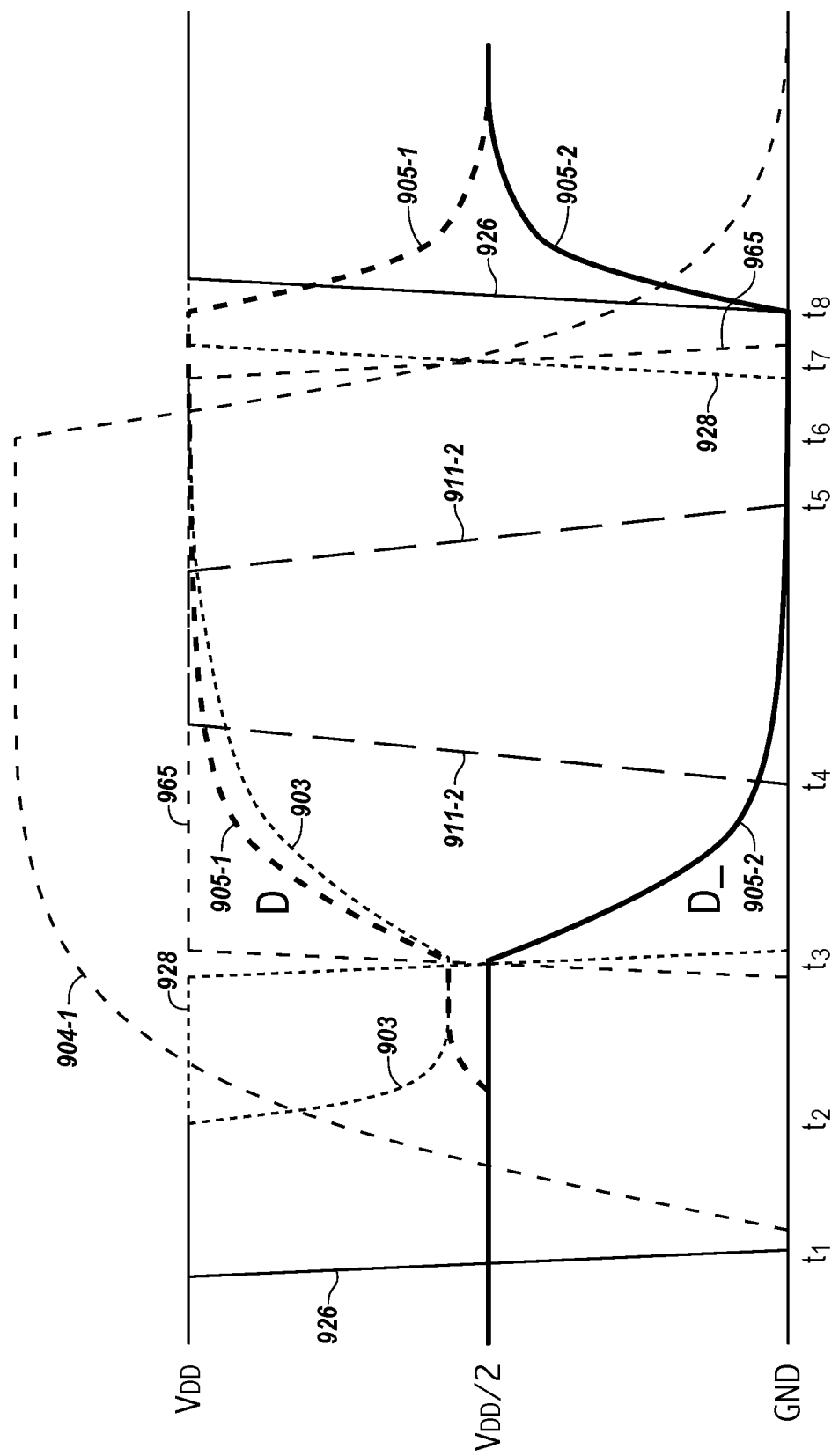
FIG. 9 illustrate a timing diagram associated with performing a number of logical operations using sensing circuitry in accordance with a number of embodiments of the present disclosure.

FIGS. 8 and 9 respectively illustrate timing diagrams associated with performing a number of logical operations using sensing circuitry in accordance with a number of embodiments of the present disclosure. Timing diagrams shown in FIGS. 8 and 9 illustrate signals (e.g., voltage signals) associated with performing a number of intermediate operation phases of a logical operation (e.g., an R-input logical operation). For instance, timing diagram shown in FIG. 8 corresponds to a number of intermediate operation phases of an R-input NAND operation or an R-input AND operation, and timing diagram shown in FIG. 9 corresponds to a number of intermediate operation phases of an R-input NOR operation or an R-input OR operation. For example, performing an AND or NAND operation can include performing the operation phase shown in FIG. 8 one or more times subsequent to an initial operation phase such as that described with respect to FIG. 7. Similarly, performing an OR or NOR operation can include performing the operation phase shown and described with respect to FIG. 9 one or more times subsequent to an initial operation phase such as that described with respect to FIG. 7.

As shown in the timing diagrams illustrated in FIGS. 8 and 9, at time $t_1$, equilibration is disabled (e.g., the equilibration signal 826/926 is deactivated), and then a selected row is enabled (e.g., the row corresponding to a memory cell whose data value is to be sensed and used as an input such as a second input, third input, etc.). Signal 804-1/904-1 represents the voltage signal applied to the selected row (e.g., Row Y 204-Y shown in FIG. 2A). When row signal 804-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 805-1/905-1 and 805-2/905-2, respectively) between times $t_2$ and $t_3$. The voltage of the selected cell is represented by signal 803/903. Due to conservation of energy, creating the differential signal between D and D_ (e.g., by coupling the cell to data line D) does not consume energy, since the energy associated with activating/deactivating the row signal 804-1/904-1 can be amortized over the plurality of memory cells coupled to the row.

At time $t_3$, the sense amplifier (e.g., 206 shown in FIG. 2A) is enabled (e.g., a positive control signal 865/965 (e.g., corresponding to ACT 233 shown in FIG. 2B) goes high, and the negative control signal 828/928 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 8 and 9, at time $t_4$ (e.g., after the selected cell is sensed), only one of control signals 811-1 (Passd) shown in FIGS. 8 and 911-2 (Passdb) shown in FIG. 9 is activated (e.g., only one of pass transistors (if present) is enabled), depending on the particular logic operation. For example, since the timing diagram illustrated in FIG. 8 corresponds to an intermediate phase of a NAND or AND operation, control signal 811-1 (Passd) is activated at time $t_4$ to turn on the pass transistor coupling the primary latch to data line D and the Passdb control signal remains deactivated leaving the pass transistor coupling the primary latch to data line D_ turned off. Conversely, since the timing diagram illustrated in FIG. 9 corresponds to an intermediate phase of a NOR or OR operation, control signal 911-2 (Passdb) is activated at time $t_4$ to turn on the pass transistor coupling the primary latch to data line D_ and control signal Passd remains deactivated leaving the pass transistor coupling the primary latch to data line D turned off. Recall from above that the accumulator control signals 712-1 (Accumb) and 712-2 (Accum) were activated during the initial operation phase described with respect to FIG. 7, and they remain activated during the intermediate operation phase(s).

Since the accumulator was previously enabled, activating only Passd (811-1 as shown in FIG. 8) results in accumulating the data value corresponding to the voltage signal 805-1 shown in FIG. 8 corresponding to data line D. Similarly, activating only Passdb (911-2 as shown in FIG. 9) results in accumulating the data value corresponding to the voltage signal 905-2 corresponding to data line D_. For instance, in an example AND/NAND operation shown in the timing diagram illustrated in FIG. 8 in which only Passd (811-1) is activated, if the data value stored in the second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (Os) accumulator.

Similarly, in an example OR/NOR operation shown in the timing diagram illustrated in FIG. 9 in which only Passdb 911-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (is) accumulator since voltage signal 905-2 on D_ is setting the true data value of the accumulator.

At the conclusion of an intermediate operation phase such as that shown in FIG. 8 or 9, the Passd signal 811-1 (e.g., for AND/NAND) or the Passdb signal 911-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 8 or 9 can be repeated in order to accumulate results from a number of additional rows. As an example, the sequence of timing diagram illustrated in FIGS. 8 and/or 9 can be performed a subsequent (e.g., second) time for a third memory cell, a subsequent (e.g., third) time for a fourth memory cell, etc. For instance, for a 10-input NOR operation, the intermediate phase shown in FIG. 9 can occur 9 times to provide 9 inputs of the 10-input logical operation, with the tenth input being determined during the initial operation phase (e.g., as described with respect to FIG. 7).

Figure 10:
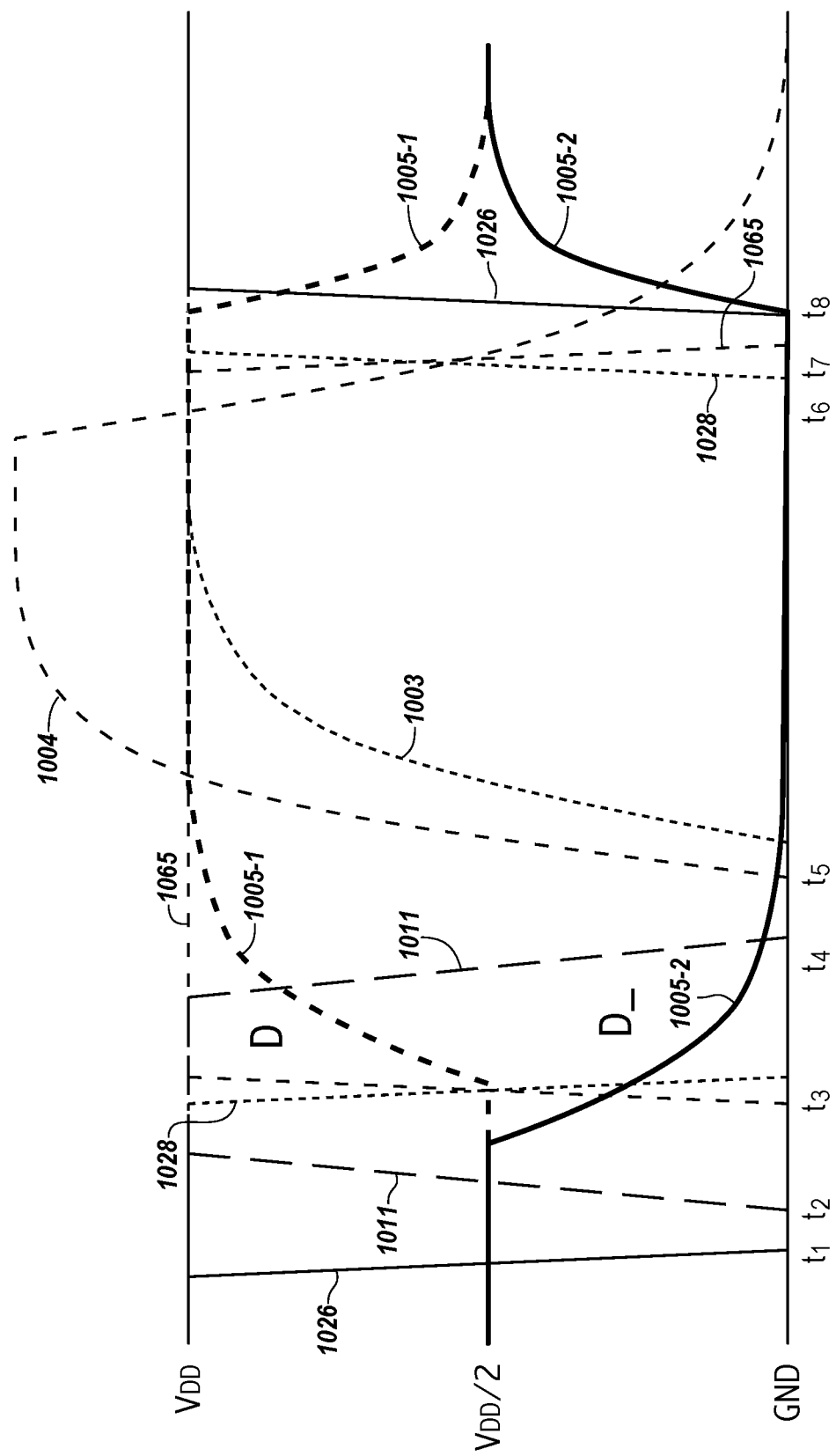
FIG. 10 illustrates a timing diagram associated with performing a number of logical operations using sensing circuitry in accordance with a number of embodiments of the present disclosure.

FIG. 10 illustrates a timing diagram associated with performing a number of logical operations using sensing circuitry in accordance with a number of embodiments of the present disclosure. The timing diagram illustrated in FIG. 10 shows signals (e.g., voltage signals) associated with performing a last operation phase of a logical operation (e.g., an R-input logical operation). For instance, the timing diagram illustrated in FIG. 10 corresponds to a last operation phase of an R-input AND operation or an R-input OR operation.

For example, performing a last operation phase of an R-input can include performing the operation phase shown in FIG. 10 subsequent to a number of iterations of the intermediate operation phase(s) described in association with FIGS. 8 and/or 9. Table 2 shown below indicates the Figures corresponding to the sequence of operation phases associated with performing a number of R-input logical operations in accordance with a number of embodiments described herein.

TABLE 2

| Operation | FIG. 7 | FIG. 8 | FIG. 9 | FIG. 10 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 10 is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 10, at time $t_1$, equilibration is disabled (e.g., the equilibration signal 1026 is deactivated) such that data lines D and D_ are floating. At time t2, the Passd control signal 1011 (and Passdb signal) is activated for an AND or OR operation.

Activating the Passd control signal 1011 (and Passdb signal) (e.g., in association with an AND or OR operation) transfers the accumulated output stored in the secondary latch of compute component 231-6 shown in FIG. 2A to the primary latch of sense amplifier 206. For instance, for an AND operation, if any of the memory cells sensed in the prior operation phases (e.g., the first operation phase illustrated in FIG. 7 and one or more iterations of the intermediate operation phase illustrated in FIG. 8) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 1065 (e.g., corresponding to ACT 265 shown in FIG. 2B) goes high and the negative control signal 1028 (e.g., corresponding to RnIF 228 shown in FIG. 2B) goes low), which amplifies the differential signal between data lines D and D such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 7 and one or more iterations of the intermediate operation phase shown in FIG. 9) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 10, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "O"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 10 show, at time t3, the positive control signal 1065 and the negative control signal 1028 being deactivated (e.g., signal 1065 goes high and signal 1028 goes low) to disable the sense amplifier 206 shown in FIG. 2A. At time t4 the Passd control signal 1011 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after the Passd control signal 1011 (and Passdb signal) are deactivated).

As shown in FIG. 10, at time t5, a selected row is enabled (e.g., by row activation signal 1004 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 1028 and negative control signal 1065 are deactivated), and at time t8 equilibration occurs (e.g., signal 1026 is activated and the voltages on the complementary data lines 1005-1 (D) and 1005-2 (D_) are brought to the equilibration voltage).

Although the example of performing a last operation phase of an R-input was discussed above with respect to FIG. 10 for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

Figure 11:
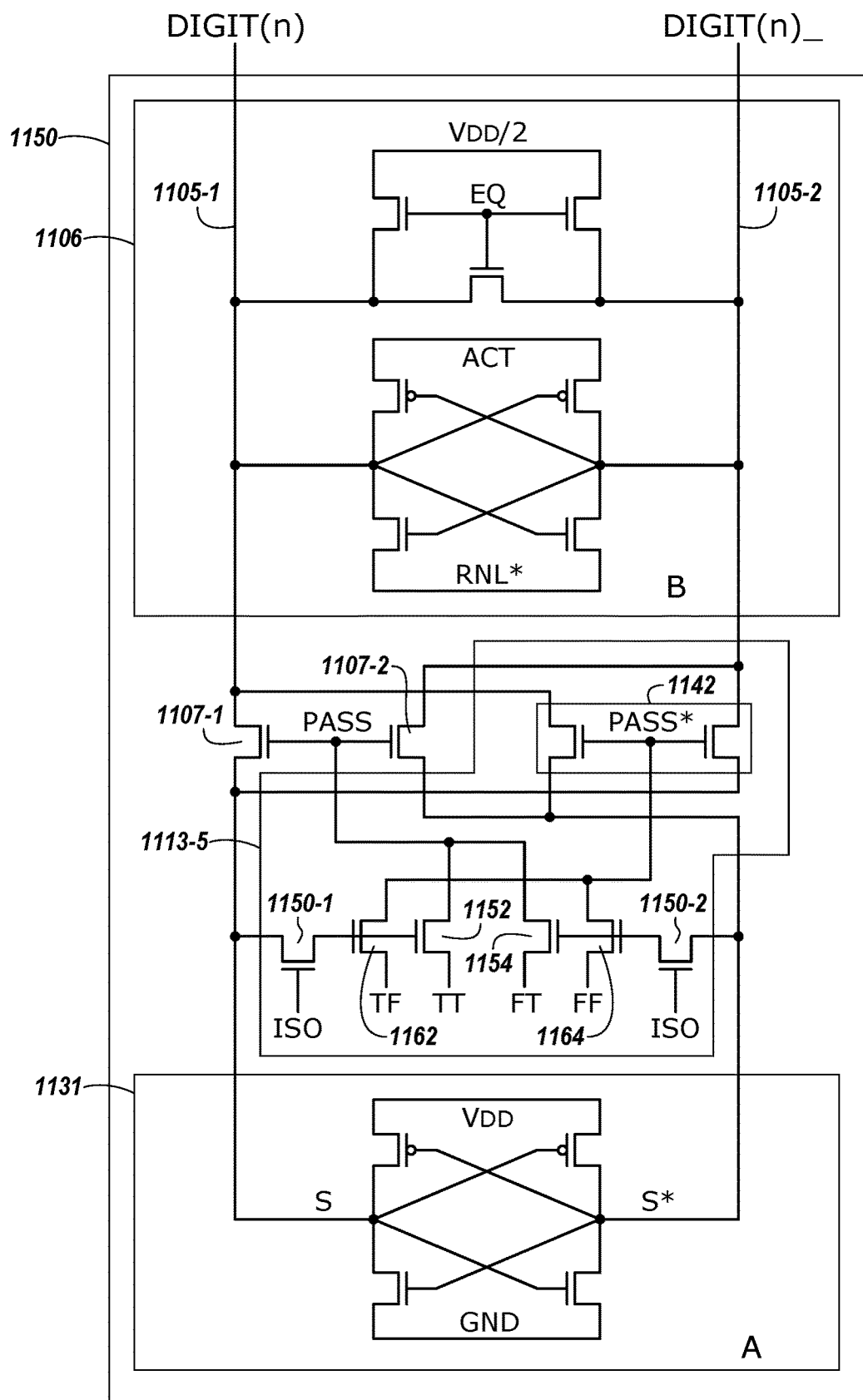
FIG. 11 is a schematic diagram illustrating sensing circuitry having selectable logical operation selection logic in accordance with a number of embodiments of the present disclosure.

FIG. 11 is a schematic diagram illustrating sensing circuitry having selectable logical operation selection logic in accordance with a number of embodiments of the present disclosure. FIG. 11 shows a sense amplifier 1106 coupled to a pair of complementary sense lines 1105-1 and 1105-2, and a compute component 1131 coupled to the sense amplifier 1106 via pass gates 1107-1 and 1107-2. The gates of the pass gates 1107-1 and 1107-2 can be controlled by a logical operation selection logic signal, PASS, which can be output from logical operation selection logic 1113-5. FIG. 11 shows the compute component 1131 labeled "A" and the sense amplifier 1106 labeled "B" to indicate that the data value stored in the compute component 1131 is the "A" data value and the data value stored in the sense amplifier 1106 is the "B" data value shown in the logic tables illustrated with respect to FIG. 12.

The sensing circuitry 1150 illustrated in FIG. 11 includes logical operation selection logic 1113-5. In this example, the logic 1113-5 comprises swap gates 1142 controlled by a logical operation selection logic signal PASS*. The logical operation selection logic 1113-5 also comprises four logic selection transistors: logic selection transistor 1162 coupled between the gates of the swap transistors 1142 and a TF signal control line, logic selection transistor 1152 coupled between the gates of the pass gates 1107-1 and 1107-2 and a TT signal control line, logic selection transistor 1154 coupled between the gates of the pass gates 1107-1 and 1107-2 and a FT signal control line, and logic selection transistor 1164 coupled between the gates of the swap transistors 1142 and a FF signal control line. Gates of logic selection transistors 1162 and 1152 are coupled to the true sense line (e.g., 1105-1) through isolation transistor 1181-1 (having a gate coupled to an ISO signal control line), and gates of logic selection transistors 1164 and 1154 are coupled to the complementary sense line (e.g., 1105-2) through isolation transistor 1181-2 (also having a gate coupled to an ISO signal control line).

Logic selection transistors 1152 and 1154 are arranged similarly to transistor 207-1 (coupled to an AND signal control line) and transistor 207-2 (coupled to an OR signal control line) respectively, as shown in FIG. 2A. Operation of logic selection transistors 1152 and 1154 are similar based on the state of the TT and FT selection signals and the data values on the respective complementary sense lines at the time the ISO signal is asserted. Logic selection transistors 1162 and 1164 also operate in a similar manner to control continuity of the swap transistors 1142. That is, to OPEN (e.g., turn on) the swap transistors 1142, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1142 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 11 are summarized in the logic table illustrated in FIG. 12.

Figure 12:
FIG. 12 is a logic table illustrating selectable logic operation results implemented by a sensing circuitry in accordance with a number of embodiments of the present disclosure.

FIG. 12 is a logic table illustrating selectable logic operation results implementable by the sensing circuitry shown in FIG. 11 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1106 and compute component 1131. The four control signals, in conjunction with a particular data value present on the complementary sense lines, controls the continuity of the pass gates 1107-1 and 1107-2 and swap transistors 1142, which in turn affects the data value in the compute component 1131 and/or sense amplifier 1106 before/after firing. The capability to selectably control continuity of the swap transistors 1142 facilitates implementing logical operations involving inverse data values (e.g., inverse operands and/or inverse result), among others.

The logic table illustrated in FIG. 12 shows the starting data value stored in the compute component 1131 shown in column A at 1244, and the starting data value stored in the sense amplifier 1106 shown in column B at 1245. The other 3 top column headings (NOT OPEN, OPEN TRUE, and OPEN INVERT) in the logic table of FIG. 12 refer to the continuity of the pass gates 1107-1 and 1107-2, and the swap transistors 1142, which can respectively be controlled to be OPEN or CLOSED depending on the state of the four logic selection control signals (e.g., TF, TT, FT, and FF), in conjunction with a particular data value present on the pair of complementary sense lines 1105-1 and 1105-2 when the ISO control signal is asserted. The "Not Open" column corresponds to the pass gates 1107-1 and 1107-2 and the swap transistors 1142 both being in a non-conducting condition, the "Open True" corresponds to the pass gates 1107-1 and 1107-2 being in a conducting condition, and the "Open Invert" corresponds to the swap transistors 1142 being in a conducting condition. The configuration corresponding to the pass gates 1107-1 and 1107-2 and the swap transistors 1142 both being in a conducting condition is not reflected in the logic table of FIG. 12 since this results in the sense lines being shorted together.

Via selective control of the continuity of the pass gates 1107-1 and 1107-2 and the swap transistors 1142, each of the three columns of the first set of two rows of the upper portion of the logic table of FIG. 12 can be combined with each of the three columns of the second set of two rows below the first set to provide 3×3=9 different result combinations, corresponding to nine different logical operations, as indicated by the various connecting paths shown at 1275. The nine different selectable logical operations that can be implemented by the sensing circuitry 1150 are summarized in the logic table illustrated in FIG. 12.

The columns of the lower portion of the logic table illustrated in FIG. 12 show a heading 1280 that includes the state of logic selection control signals. For example, the state of a first logic selection control signal is provided in row 1276, the state of a second logic selection control signal is provided in row 1277, the state of a third logic selection control signal is provided in row 1278, and the state of a fourth logic selection control signal is provided in row 1279. The particular logical operation corresponding to the results is summarized in row 1247.

As such, the sensing circuitry shown in FIG. 11 can be used to perform various logical operations as shown in FIG. 12. For example, the sensing circuitry 1150 can be operated to perform various logical operations (e.g., AND and OR logical operations) in association with comparing data patterns in memory in accordance with a number of embodiments of the present disclosure.

The present disclosure includes apparatuses and methods related to performing comparison operations in memory. An example apparatus might include a first group of memory cells coupled to a first access line. A first element can be stored in the first group of memory cells. An example apparatus might include a second group of memory cells coupled to a second access line. A second element can be stored in the second group of memory cells. An example apparatus might also include sensing circuitry configured to compare the first element with the second element by performing a number of AND operations, OR operations, SHIFT operations, and INVERT operations without transferring data via an input/output (I/O) line.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a first group of memory cells coupled to a first access line of an array of memory cells and configured to store a first element;
   a second group of memory cells coupled to a second access line of the array of memory cells and configured to store a second element;
   sensing circuitries coupled to a respective plurality of columns of the array of memory cells corresponding to the first group of memory cells and the second group of memory cells; and
   a controller coupled to the sensing circuitries and configured to control the sensing circuitries to perform a number of AND operations, OR operations, shift operations, and invert operations to compare the first element to the second element.

2. The apparatus of claim 1, wherein the sensing circuitries are controlled to perform the number of AND operations, OR operations, invert operations, and shift operations without performing a sense line address access.

3. The apparatus of claim 1, wherein the sensing circuitries comprises a sense amplifier and a compute component corresponding to each respective one of the number of columns.

4. The apparatus of claim 3, wherein the sense amplifier further comprises a primary latch and the compute component comprises a secondary latch.

5. The apparatus of claim 1, wherein the apparatus is a system comprising a host processing resource external to a processing in memory device comprising the controller and the sensing circuitries.

6. The apparatus of claim 5, wherein the system is configured to compare the first element to the second element without transferring the first element or the second element to the host processing resource.

7. A method for comparing elements comprising:
   performing, using sensing circuitries coupled to respective columns of an array of memory cells corresponding to a first group of memory cells and a second group of memory cells, a comparison operation on:
      a first element stored in the first group of memory cells coupled to a first access line and to a number of complementary sense lines corresponding to the respective columns; and
      a second element stored in the second group of memory cells coupled to a second access line and to the number of complementary sense lines corresponding to the respective columns sense lines of the array;
   wherein the comparison operation provides a result that indicates whether the first element is equal to the second element or which of the first element and the second element is greater.

8. The method of claim 7, further comprising storing the first element as a first bit-vector in the first group of memory cells, wherein each memory cell in the first group of memory cells stores a respective bit from the first bit-vector.

9. The method of claim 8, further comprising storing the second element as a second bit-vector in the second group of memory cells, wherein each memory cell in the second group of memory cells stores a respective bit from the second bit-vector.

10. The method of claim 7, wherein the first element is a first value and the second element is a second value, and wherein the result of the comparison operation indicates whether the first value is equal to the second value or which of the first value and the second value is greater.

11. The method of claim 7, further comprising storing the result in a third group of memory cells coupled to a third access line and to the number of complementary sense lines corresponding to the respective columns.

12. A system, comprising:
   a memory device comprising:
      an array of memory cells comprising:
         a first group of memory cells coupled to a first access line of the array of memory cells and configured to store a first element;
         a second group of memory cells coupled to a second access line of the array of memory cells and configured to store a second element; and
         a third group of memory cells; and
      sensing circuitries coupled to respective columns of the array of memory cells corresponding to the first group of memory cells and the second group of memory cells; and
   a controller coupled to the sensing circuitries and configured to control the sensing circuitries to:
      perform a comparison operation by comparing the first element stored in the first group of memory cells and the second element stored in the second group of memory cells; and
      store a result of the comparison operation in the third group of memory cells.

13. The system of claim 12, wherein the third group of memory cells is a same group of memory cells as at least one of:
   the first group of memory cells coupled to the first access line; and
   the second group of memory cells coupled to the second access line.

14. The system of claim 12, wherein the third group of memory cells are coupled to a third access line of the array of memory cells and a fourth access line of the array of memory cells, wherein the third and the fourth access lines are different than the first and the second access lines.

15. The system of claim 14, wherein the controller is configured to control the sensing circuitries to store the result of the comparison operation as:

a first bit-vector stored in a number of memory cells of the third group that are coupled to the third access line; and a second bit-vector stored in a number of memory cells of the third group that are coupled to the fourth access line.

16. The system of claim 15, wherein the controller is configured to control the sensing circuitries to, responsive to the first element being greater than the second element, store the first bit-vector as a first bit pattern and the second bit-vector as a second bit pattern.

17. The system of claim 16, wherein the controller is configured to control the sensing circuitries to, responsive to the second element being greater than the first element, store the first bit-vector as the second bit pattern and the second bit-vector as the first bit pattern.

18. The system of claim 12, wherein the first element is one of a plurality of first elements stored in the first group of memory cells, wherein the second element is one of a plurality of second elements stored in the second group of memory cells, and wherein the controller is configured to control the sensing circuitries to perform a plurality of comparison operations, in parallel, on respective first element and second element pairs.

* * * * *